(12) United States Patent
Katrak

(10) Patent No.: US 10,353,015 B2
(45) Date of Patent: Jul. 16, 2019

(54) DIAGNOSTIC SYSTEM FOR A DC-DC VOLTAGE CONVERTER

(71) Applicant: LG Chem, Ltd., Seoul (KR)

(72) Inventor: Kerfegar K. Katrak, Fenton, MI (US)

(73) Assignee: LG Chem, Ltd., Seoul (KR)

( * ) Notice: Subject to any disclaimer, the term of this patent is extended or adjusted under 35 U.S.C. 154(b) by 13 days.

(21) Appl. No.: 15/910,422

(22) Filed: Mar. 2, 2018

(65) Prior Publication Data

US 2019/0025383 A1     Jan. 24, 2019

Related U.S. Application Data

(60) Provisional application No. 62/536,153, filed on Jul. 24, 2017.

(51) Int. Cl.
| | |
|---|---|
| *G01R 31/40* | (2014.01) |
| *G01R 1/20* | (2006.01) |
| *H02M 1/08* | (2006.01) |
| *H02M 1/32* | (2007.01) |
| *H02M 3/157* | (2006.01) |
| *H02M 3/04* | (2006.01) |

(52) U.S. Cl.
CPC ............ *G01R 31/40* (2013.01); *G01R 1/206* (2013.01); *H02M 1/08* (2013.01); *H02M 1/32* (2013.01); *H02M 3/157* (2013.01); *H02M 3/04* (2013.01)

(58) Field of Classification Search
CPC ............ G01R 1/206; H02M 3/04; H02M 1/08
See application file for complete search history.

(56) References Cited

U.S. PATENT DOCUMENTS

| | | | |
|---|---|---|---|
| 6,741,436 B2 | 5/2004 | Gilbert et al. | |
| 7,923,865 B2 | 4/2011 | Melse | |
| 8,138,733 B2 * | 3/2012 | Wang | H02M 3/157 323/241 |
| 8,385,030 B2 | 2/2013 | Maher | |
| 8,587,283 B2 | 11/2013 | Wu | |

(Continued)

FOREIGN PATENT DOCUMENTS

| | | |
|---|---|---|
| JP | 4630173 B2 | 2/2011 |
| KR | 20120092681 A | 8/2012 |
| KR | 101283256 B1 | 7/2013 |

OTHER PUBLICATIONS

U.S. Appl. No. 15/646,155, filed Jul. 11, 2017 entitled Diagnostic System for a DC-DC Voltage Converter.

(Continued)

*Primary Examiner* — Jermele M Hollington
*Assistant Examiner* — Alvaro E Fortich
(74) *Attorney, Agent, or Firm* — Buckert Patent & Trademark Law Firm PC; John F. Buckert

(57) ABSTRACT

A diagnostic system for a DC-DC voltage converter is provided. An analog to digital converter measures a first low voltage level at a low voltage terminal of a DC-DC voltage converter and generates a first low voltage value based on the first low voltage level. A first buck mode monitoring application sets a first buck mode status flag equal to a first fault value when the first low voltage value is greater than a first maximum voltage value. A first buck mode diagnostic handler application transitions each of the high voltage switch and the low voltage switch to an open operational state when the first buck mode status flag is equal to the first fault value.

17 Claims, 22 Drawing Sheets

(56) References Cited

U.S. PATENT DOCUMENTS

| | | |
|---|---|---|
| 8,907,642 B1 | 12/2014 | Burstein et al. |
| 9,759,784 B2 | 9/2017 | Lachaize et al. |
| 2010/0202161 A1 | 8/2010 | Sims et al. |
| 2011/0128761 A1 | 6/2011 | Ripley et al. |
| 2013/0293211 A1* | 11/2013 | Chen .................. H02M 3/1588 323/282 |
| 2016/0118900 A1 | 4/2016 | Nate et al. |
| 2017/0077817 A1* | 3/2017 | Houston ............. H02M 3/1582 |
| 2017/0363691 A1 | 12/2017 | Katrak et al. |
| 2017/0363692 A1 | 12/2017 | Katrak et al. |
| 2017/0365996 A1 | 12/2017 | Katrak et al. |

OTHER PUBLICATIONS

U.S. Appl. No. 15/651,005, filed Jul. 17, 2017 entitled Control System for Controlling Operational Modes of a DC-DC Voltage Converter.

U.S. Appl. No. 15/682,143, filed Aug. 21, 2017 entitled Control System for Transitioning a DC-DC Voltage Converter From a Buck Operational Made to a Safe Operational Mode.

U.S. Appl. No. 15/722,326, filed Oct. 2, 2017 entitled Control System for Transtioning a DC-DC Converter From a Boost Operational Mode to a Safe Operational Mode.

U.S. Appl. No. 15/808,967, filed Nov. 10, 2017 entitled Diagnostic System for a DC-DC Voltage Converter.

* cited by examiner

DIAGNOSTIC SYSTEM FOR A DC-DC VOLTAGE CONVERTER

CROSS-REFERENCE TO RELATED APPLICATION

This application claims priority to U.S. Provisional Patent Application No. 62/536,153 filed on Jul. 24, 2017, the entire contents of which are hereby incorporated by reference herein.

BACKGROUND

The inventor herein has recognized a need for an improved diagnostic system for a DC-DC voltage converter that can operate in both buck and boost operational modes that utilizes fault values and non-fault values having a Hamming distance of at least four from one another to eliminate memory overwrite errors associated with status flags utilizing the values.

SUMMARY

A diagnostic system for a DC-DC voltage converter operating in a buck operational mode in accordance with an exemplary embodiment is provided. The DC-DC voltage converter has a high voltage switch, a low voltage switch, a DC-DC converter control circuit, a high voltage terminal, and a low voltage terminal. The DC-DC converter control circuit is electrically coupled between and to the high voltage switch and the low voltage switch. The high voltage switch is further electrically coupled to the high voltage terminal. The low voltage switch is further electrically coupled to the low voltage terminal. The diagnostic system includes a microcontroller having a microprocessor and an analog-to-digital converter. The microprocessor has a first buck mode monitoring application, a first buck mode diagnostic handler application, a second buck mode monitoring application, and a second buck mode diagnostic handler application. The analog to digital converter measures a first low voltage level at the low voltage terminal of the DC-DC voltage converter and generates a first low voltage value based on the first low voltage level. The first buck mode monitoring application sets a first buck mode status flag equal to a first fault value when the first low voltage value is greater than a first maximum voltage value. The first buck mode diagnostic handler application transitions each of the high voltage switch and the low voltage switch to an open operational state when the first buck mode status flag is equal to the first fault value. The analog to digital converter measures a second low voltage level at the low voltage terminal of the DC-DC voltage converter and generates a second low voltage value based on the second low voltage level. The second buck mode monitoring application sets a second buck mode status flag equal to a second fault value when the second low voltage value is greater than a second maximum voltage value. The second maximum voltage value is greater than the first maximum voltage value. The second fault value has a Hamming distance of at least four from the first fault value. The second buck mode diagnostic handler application transitions each of the high voltage switch and the low voltage switch to the open operational state when the second buck mode status flag is equal to the second fault value.

A diagnostic system for a DC-DC voltage converter operating in a boost operational mode in accordance with another exemplary embodiment is provided. The DC-DC voltage converter has a high voltage switch, a low voltage switch, a DC-DC converter control circuit, a high voltage terminal, and a low voltage terminal. The DC-DC converter control circuit is electrically coupled between and to the high voltage switch and the low voltage switch. The high voltage switch is further electrically coupled to the high voltage terminal. The low voltage switch is further electrically coupled to the low voltage terminal. The diagnostic system includes a microcontroller having a microprocessor and an analog-to-digital converter. The microprocessor has a first boost mode monitoring application, a first boost mode diagnostic handler application, a second boost mode monitoring application, and a second boost mode diagnostic handler application. The analog to digital converter measures a first high voltage level at the high voltage terminal of the DC-DC voltage converter and generates a first high voltage value based on the first high voltage level. The first boost mode monitoring application sets a first boost mode status flag equal to a first fault value when the first high voltage value is greater than a first maximum voltage value. The first boost mode diagnostic handler application transitions each of the high voltage switch and the low voltage switch to an open operational state when the first boost mode status flag is equal to the first fault value. The analog to digital converter measures a second high voltage level at the high voltage terminal of the DC-DC voltage converter and generates a second high voltage value based on the second high voltage level. The second boost mode monitoring application sets a second boost mode status flag equal to a second fault value when the second high voltage value is greater than a second maximum voltage value. The second maximum voltage value is greater than the first maximum voltage value. The second fault value has a Hamming distance of at least four from the first fault value. The second boost mode diagnostic handler application transitions each of the high voltage switch and the low voltage switch to the open operational state when the second boost mode status flag is equal to the second fault value.

DETAILED DESCRIPTION

Figure 1:
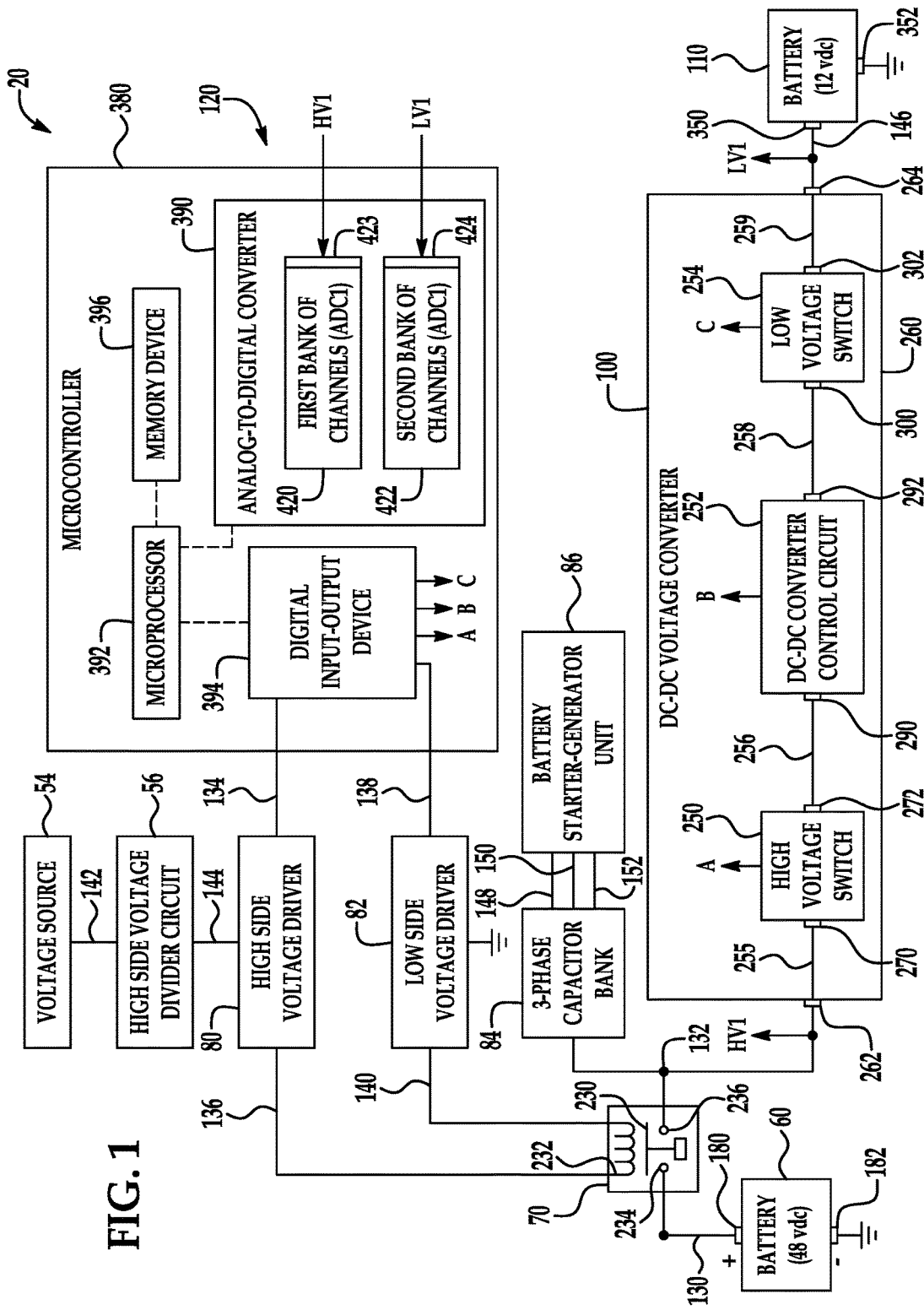
FIG. 1 is a schematic of a vehicle having a diagnostic system for a DC-DC voltage converter in accordance with an exemplary embodiment.

Referring to FIG. 1, a vehicle 20 is provided. The vehicle 20 includes a voltage source 54, a high side voltage divider circuit 56, a battery 60, a contactor 70, a high side voltage driver 80, a low side voltage driver 82, a 3-phase capacitor bank 84, a battery starter-generator unit 86, a DC-DC voltage converter 100, a battery 110, a diagnostic system 120, and electrical lines 130, 132, 134, 136, 138, 140, 142, 144, 146, 148, 150, 152.

An advantage of the diagnostic system 120 is that the system 120 utilizes fault values having a Hamming distance of at least four from one another to eliminate memory overwrite errors associated with status flags utilizing the values, in a buck operational mode. Further, the system 120 utilizes fault values having a Hamming distance of at least four from one another to eliminate memory overwrite errors associated with status flags utilizing the values, in a boost operational mode.

For purposes of understanding, a node is a region or a location in an electrical circuit.

The buck operational mode is an operational mode of the DC-DC voltage converter 100 in which the DC-DC voltage converter 100 applies a voltage to the battery 110. In an exemplary embodiment, when the DC-DC voltage converter 100 has the buck operational mode, the contactor 70 has a closed operational state, the high voltage switch 250 has a closed operational state, the DC-DC converter control circuit 252 has internal FET switches being switched as desired, and the low voltage switch 254 has a closed operational state.

The boost operational mode is an operational mode of the DC-DC voltage converter 100 in which the DC-DC voltage converter 100 applies a voltage to the 3-phase capacitor bank 84. In an exemplary embodiment, when the DC-DC voltage converter 100 has the boost operational mode, the contactor 70 has an open operational state, the high voltage switch 250 has a closed operational state, the DC-DC converter control circuit 252 has internal FET switches being switched as desired, and the low voltage switch 254 has a closed operational state.

The voltage source 54 is provided to generate a first voltage (e.g., 48 Vdc) that is received by the high side voltage divider circuit 56. The voltage source 54 is electrically coupled to the high side voltage divider circuit 56 utilizing the electrical line 142. The high side voltage divider circuit 56 receives the first voltage from the voltage source 54 and outputs a second voltage that is received by the high side voltage driver 80 utilizing the electrical line 144.

The battery 60 includes a positive terminal 180 and a negative terminal 182. In an exemplary embodiment, the battery 60 generates 48 Vdc between the positive terminal 180 and the negative terminal 182. The positive terminal 180 is electrically coupled to a node 234 of the contactor 70. The negative terminal 182 is electrically coupled to electrical ground.

The contactor 70 has a contact 230, a contactor coil 232, a first node 234, and a second node 236. The first node 234 is electrically coupled to the positive terminal 180 of the battery 60 utilizing the electrical line 130. The second node 236 is electrically coupled to the high voltage terminal 262 of the DC-DC voltage converter 100 utilizing the electrical line 132. When the digital input-output device 394 of the microcontroller 380 generates first and second control signals that are received by the high side voltage driver 80 and the low side voltage driver 82, respectively, the contactor coil 232 is energized which transitions the contact 230 to a closed operational state. Alternately, when the digital input-output device 394 of the microcontroller 380 generates third and fourth control signals that are received by the high side voltage driver 80 and the low side voltage driver 82, respectively, the contactor coil 232 is de-energized which transitions the contact 230 to an open operational state. In an exemplary embodiment, the third and fourth control signals can each be a ground voltage level.

The high side voltage driver 80 and the low side voltage driver 82 are provided to energize or de-energize the contactor coil 232.

The high side voltage driver 80 is electrically coupled to a digital input-output device 394 of the microcontroller 380 utilizing the electrical line 134. The high side voltage driver 80 is further electrically coupled to a first end of the contactor coil 232 utilizing the electrical line 136. The high side voltage driver 80 is further electrically coupled to the high side voltage divider circuit 56 via the electrical line 144. The high side voltage driver 144 utilizes the second voltage from the high side voltage divider circuit 56 and outputs a pulse width modulated signal on electrical line 136 for energizing the contactor coil 232, when the high side voltage driver 144 receives a control signal from the digital input-output device 394.

The low side voltage driver 82 is electrically coupled to the digital input-output device 394 of the microcontroller 380 utilizing the electrical line 138. The low side voltage driver 82 is further electrically coupled to a second end of the contactor coil 232 utilizing the electrical line 140. The low side voltage driver 82 is configured to conduct an electrical current therethrough to the electrical ground for energizing the contactor coil 232, when the low side voltage driver 82 receives a control signal from the digital input-output device 394.

The 3-phase capacitor bank 84 is utilized to store and release electrical energy from the battery starter-generator unit 86, the battery 60, and the DC-DC voltage converter 100. The 3-phase capacitor bank 84 is electrically coupled to the electrical node 236 of the contactor 70 and the high voltage terminal 262 of the DC-DC voltage converter 100 utilizing the electrical line 132. The 3-phase capacitor bank 84 is further electrically coupled to the battery-starter generator unit 86 utilizing the electrical lines 148, 150, 152.

The battery-starter generator unit 86 is provided to generate an AC voltage that is received by the 3-phase capacitor bank 84 via the electrical lines 148, 150, 152.

The DC-DC voltage converter 100 includes a high voltage switch 250, a DC-DC converter control circuit 252, a low voltage switch 254, electrical lines 255, 256, 258, 259 a housing 260, a high voltage terminal 262, and a low voltage terminal 264. The housing 260 holds the high voltage switch 250, the DC-DC converter control circuit 252, and the low voltage switch 254 therein. In buck operational mode, the DC-DC voltage converter 100 outputs a voltage from the low voltage terminal 264 for charging the battery 110. In a boost operational mode, the DC-DC voltage converter 100 outputs a voltage at the high voltage terminal 262 for charging the 3-phase capacitor bank 84.

The high voltage switch 250 includes a first node 270 and a second node 272. The first node 270 is electrically coupled to the high voltage terminal 262 utilizing the electrical line 255, and the high voltage terminal 262 is further electrically coupled to the second node 236 of the contactor 70 utilizing the electrical line 132. The second node 272 is electrically coupled to a first node 290 of the DC-DC converter control circuit 252 utilizing the electrical line 256. In an exemplary embodiment, the high voltage switch 250 is a bi-directional MOSFET switch having desired voltage and current capabilities. When the microcontroller 380 generates a first control signal that is received by the high voltage switch 250 (or that is received by a controller or a microprocessor within the DC-DC voltage converter 100 that is operably coupled to the switch 250), the microcontroller 380 induces the switch 250 to transition to a closed operational state. When the microcontroller 380 generates a second control signal, the microcontroller 380 induces the switch 250 to transition to an open operational state. In an exemplary embodiment, the second control signal is a ground level control signal.

The DC-DC converter control circuit 252 has a first node 290 and a second node 292. The DC-DC converter control circuit 252 has internal FETs that are selectively switched to convert a DC voltage received at the first node 290 to another DC voltage output at the second node 292, based on control signals from the microcontroller 380. Alternately, the DC-DC converter control circuit 252 selectively switches the internal FETs to convert a DC voltage received at the second node 292 to another DC voltage that is output at the first node 290, based on control signals from the microcontroller 380.

The low voltage switch 254 includes a first node 300 and a second node 302. The first node 300 is electrically coupled to the second node 292 of the DC-DC converter control circuit 252 utilizing the electrical line 258. The second node 302 is electrically coupled to the low voltage terminal 264 utilizing the electrical line 259, and the low voltage terminal 264 is further electrically coupled to the battery 110 utilizing the electrical line 146. In an exemplary embodiment, the low voltage switch 254 has an identical structure as the high voltage switch 250. In an exemplary embodiment, the low voltage switch 254 is a bi-directional MOSFET switch having desired voltage and current capabilities. When the microcontroller 380 generates a first control signal that is received by the low voltage switch 254 (or that is received by a controller or a microprocessor within the DC-DC voltage converter 100 that is operably coupled to the switch 254), the microcontroller 380 induces the switch 254 to transition to a closed operational state. When the microcontroller 380 generates a second control signal, the microcontroller 380 induces the switch 254 to transition to an open operational state. In an exemplary embodiment, the second control signal is a ground level control signal.

The battery 110 includes a positive terminal 350 and a negative terminal 352. In an exemplary embodiment, the battery 110 generates 12 Vdc between the positive terminal 350 and the negative terminal 352. The positive terminal 350 is electrically coupled to the low voltage terminal 264 of the DC-DC voltage converter 100. The negative terminal 352 is electrically coupled to an electrical ground, which may be electrically isolated from the electrical ground associated with the battery 60.

The diagnostic system 120 from the DC-DC voltage converter 100 includes a microcontroller 380. The microcontroller 380 has an analog-to-digital converter 390, a microprocessor 392, a digital input-output device 394, and a memory device 396.

The analog-to-digital converter 390 includes a first bank of channels 420 (also referred to as "ADC1") and a second bank of channels 422 (also referred to as "ADC2"). The first bank of channels 420 includes a channel 423 that is electrically coupled to the electrical line 132 for measuring a high voltage HV1 at the high voltage terminal 262. The second bank of channels 422 includes a channel 424 that is electrically coupled to the electrical line 146 for measuring a low voltage LV1 at the low voltage terminal 264.

The microcontroller 380 is programmed to monitor voltages utilizing the microprocessor 392 which executes software instructions stored in the memory device 396. The microprocessor 392 is operably coupled to the analog-to-digital converter 390, the digital input-output device 394, and the memory device 396. The digital input-output device 394 outputs digital control signals that are received by the voltage drivers 80, 82 for controlling the operation of the contactor 70. The memory device 396 stores data, tables, and the software applications described herein for implementing the methods described therein.

Figure 2:
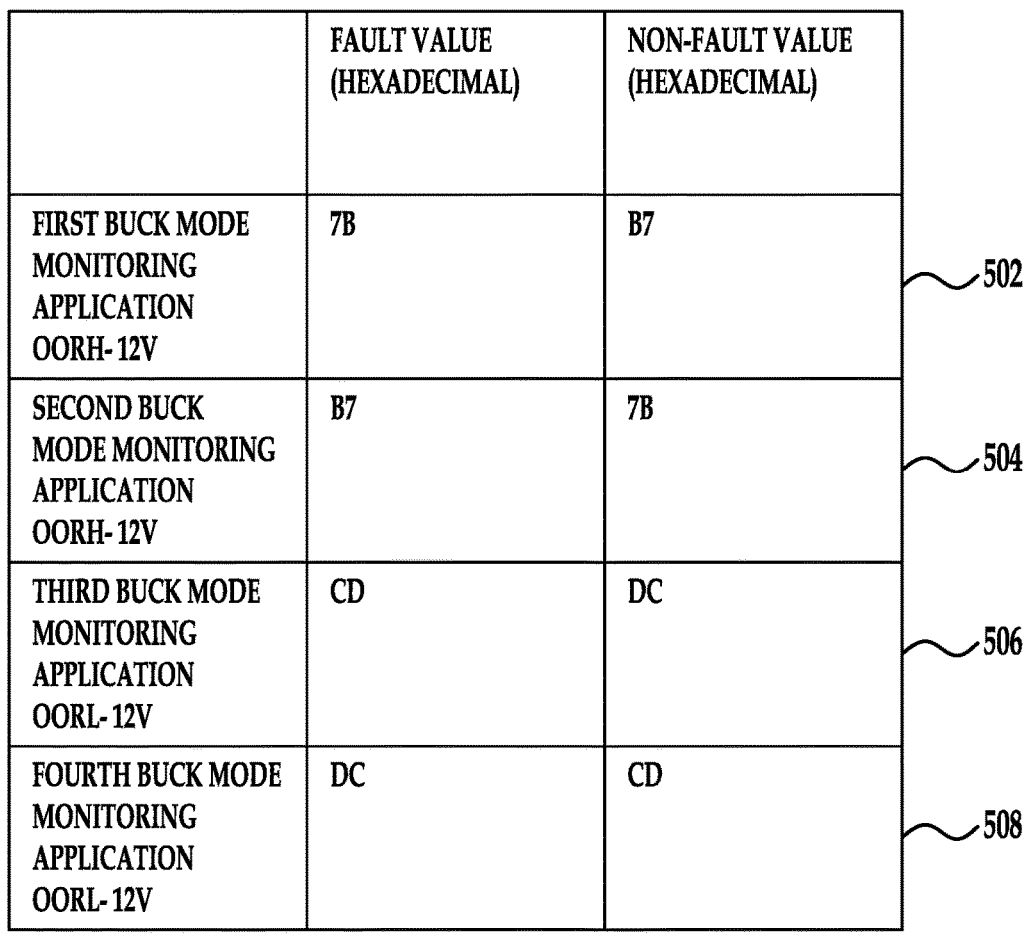
FIG. 2 is a schematic of a buck mode table utilized by the diagnostic system of FIG. 1.

Referring to FIG. 2, a buck mode table 500 that is stored in the memory device 396 and utilized by the microcontroller 380 is shown. The buck mode table 500 includes records 502, 504, 506, 508. The buck mode table 500 includes values that are utilized for setting the values of status flags associated with the DC-DC voltage converter 100. A status flag can either have a fault value indicating a fault operational condition or a non-fault value indicating a non-fault operational condition. In particular, the record 502 is associated with a first buck mode monitoring application 602 and includes a fault value of "7B" hexadecimal, and a non-fault value of "B7" hexadecimal. Further, the record 504 is associated with a second buck mode monitoring application 606 and includes a fault value of "B7" hexadecimal, and a non-fault value of "7B" hexadecimal. Further, the record 506 is associated with a third buck mode monitoring application 610 and includes a fault value of "CD" hexadecimal, and a non-fault value of "DC" hexadecimal. Also, the record 508 is associated with a fourth buck mode monitoring application 614 and includes a fault value of "DC" hexadecimal, and a non-fault value of "CD" hexadecimal.

Each of the fault values in the records 502-508 have a Hamming distance of the least four from one another to eliminate memory overwrite errors associated with status flags utilizing the values. Further, each of the non-fault values in the records 502-508 have a Hamming distance of the least four from one another to eliminate memory overwrite errors associated with status flags utilizing the values. Still further, each of the fault values in the records 502-508 have a Hamming distance of the least four from the non-fault values in the records 502-508 to eliminate memory overwrite errors associated with status flags utilizing the values.

Figure 3:
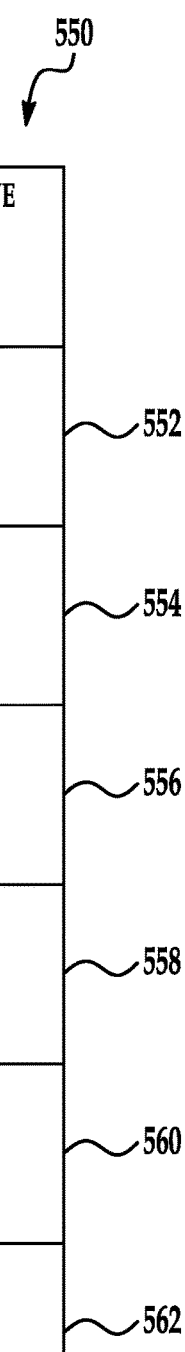
FIG. 3 is a schematic of a boost mode table utilized by the diagnostic system of FIG. 1.
Figure 4:
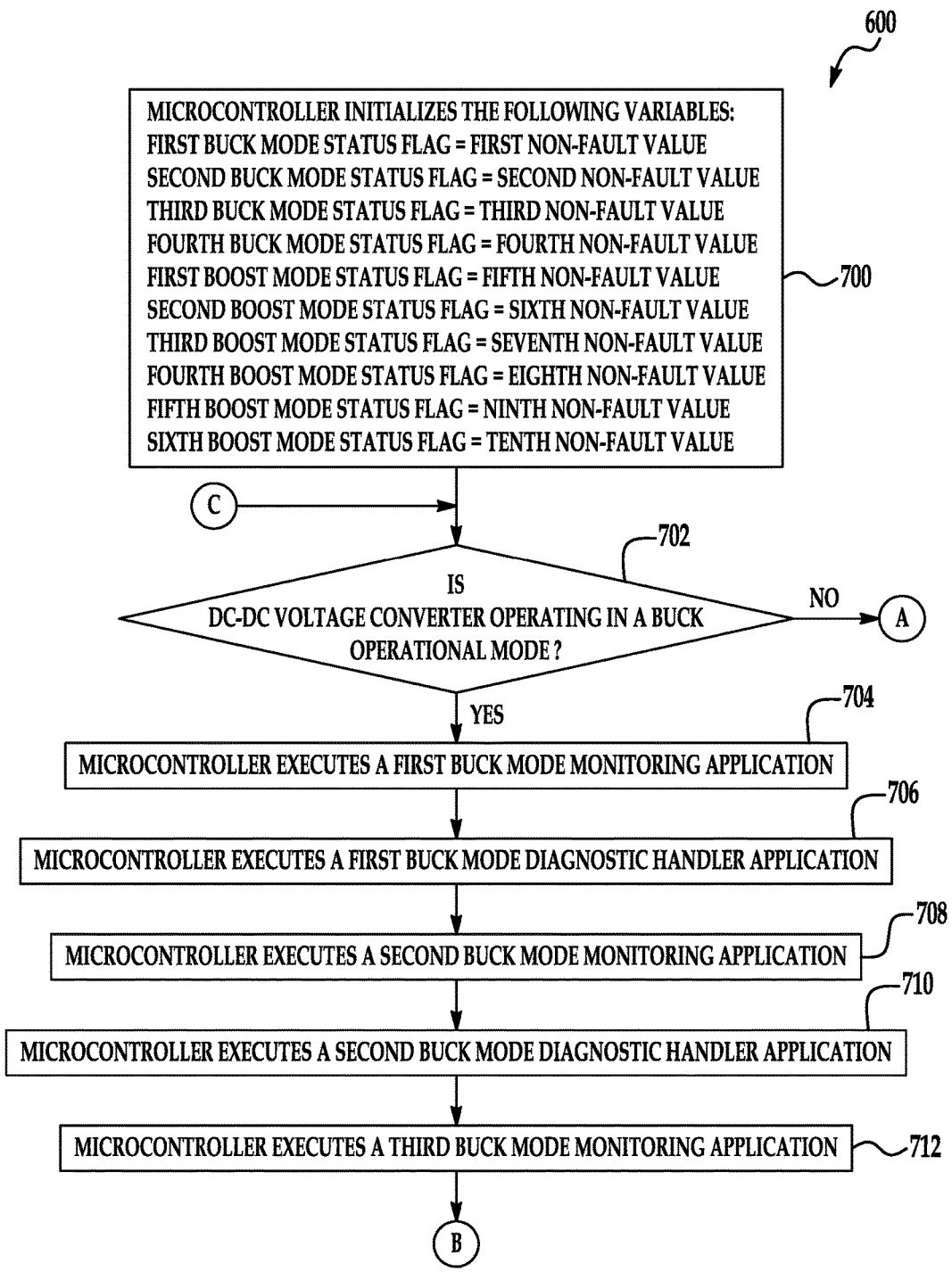
FIGS. 4-6 is a flowchart of a main application utilized in the diagnostic system of FIG. 1.
Figure 5:
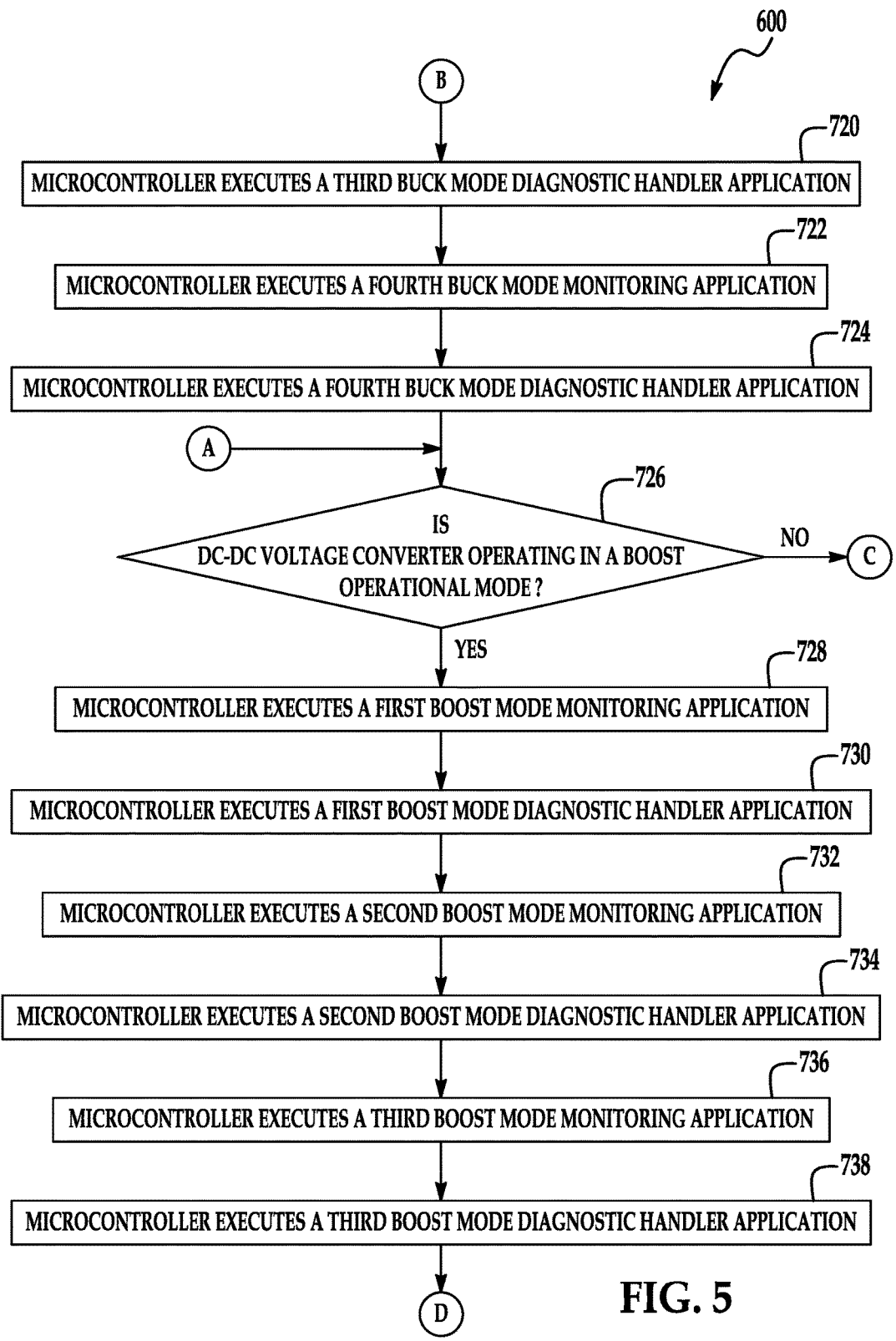
Figure 6:
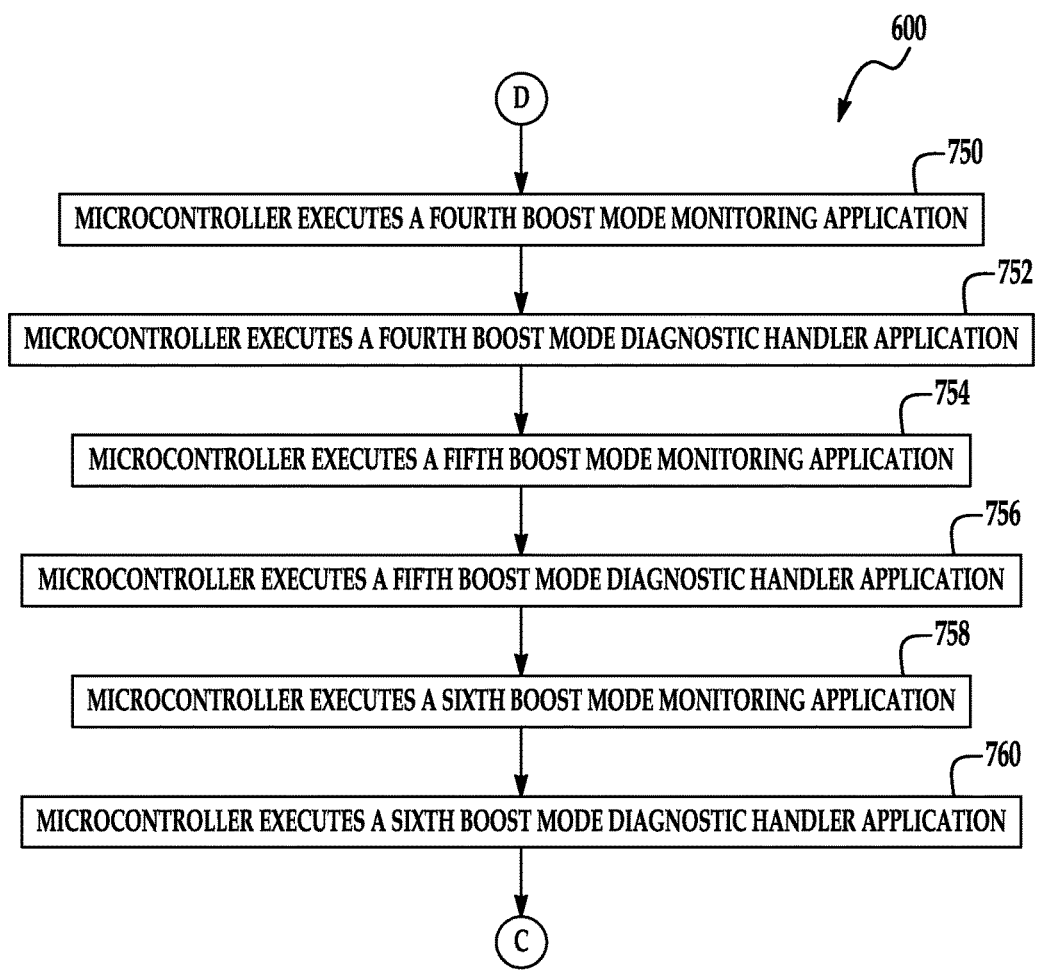

Referring to FIG. 3, a boost mode table 550 that is stored in the memory device 396 and utilized by the microcontroller 380 is shown. The boost mode table 550 includes values that are utilized for setting the values of status flags associated with the DC-DC voltage converter 100. A status flag can either have a fault value indicating a fault operational condition or a non-fault value indicating a non-fault operational condition. In particular, the boost mode table 550 includes records 552, 554, 556, 558, 560, 562. The record 552 is associated with a first boost mode monitoring application 618 and includes a fault value of "41" hexadecimal, and a non-fault value of "14" hexadecimal. Further, the record 554 is associated with a second boost mode monitoring application 622 and includes a fault value of "14" hexadecimal, and a non-fault value of "41" hexadecimal. Further, the record 556 is associated with a third boost mode monitoring application 626 and includes a fault value of "DC" hexadecimal, and a non-fault value of "CD" hexadecimal. Also, the record 558 is associated with a fourth boost mode monitoring application 629 and includes a fault value of "CD" hexadecimal, and a non-fault value of "DC" hexadecimal. Also, the record 560 is associated with a fifth boost mode monitoring application 632 and includes a fault value of "B7" hexadecimal, and a non-fault value of "7B" hexadecimal. Further, the record 562 is associated with a sixth boost mode monitoring application 636 and includes a fault value of "7B" hexadecimal, and a non-fault value of "B7" hexadecimal.

Each of the fault values in the records 552-562 have a Hamming distance of the least four from one another to eliminate memory overwrite errors associated with status flags utilizing the values. Further, each of the non-fault values in the records 552-562 have a Hamming distance of the least four from one another to eliminate memory overwrite errors associated with status flags utilizing the values. Still further, each of the fault values in the records 552-562 have a Hamming distance of the least four from the non-fault values in the records 552-562 to eliminate memory overwrite errors associated with status flags utilizing the values.

Referring to FIGS. 1 and 4-33, a method of operating the diagnostic system 120 now be explained. The method utilizes a main application 600, a first buck mode monitoring application 602, a first buck mode diagnostic handler application 604, a second buck mode monitoring application 606, a second buck mode diagnostic handler application 608, a third buck mode monitoring application 610, a third buck mode diagnostic handler application 612, a fourth buck mode monitoring application 614, a fourth buck mode diagnostic handler application 616, a first boost mode monitoring application 618, a first boost mode diagnostic handler application 620, a second boost mode monitoring application 622, a second boost mode diagnostic handler application 624, a third boost mode monitoring application 626, a third boost mode diagnostic handler application 628, a fourth boost mode monitoring application 629, a fourth boost mode diagnostic handler application 630, a fifth boost mode monitoring application 632, a fifth boost mode diagnostic handler application 634, a sixth boost mode monitoring application 636, and a sixth boost mode diagnostic handler application 638.

Referring to FIGS. 2-6, the main application 600 will now be explained.

At step 700, the microcontroller 380 initializes the following variables utilizing the non-fault values from the buck mode table 500 and the boost mode table 550: first buck mode status flag=first non-fault value; second buck mode status flag=second non-fault value; third buck mode status flag=third non-fault value; fourth buck mode status flag=fourth non-fault value; first boost mode status flag=fifth non-fault value; second boost mode status flag=sixth non-fault value; third boost mode status flag=seventh non-fault value; fourth boost mode status flag=eighth non-fault value; fifth boost mode status flag=ninth non-fault value; sixth boost mode status flag=tenth non-fault value. After step 700, the method advances to step 702.

At step 702, the microcontroller 380 makes a determination as to whether the DC-DC voltage converter 100 is operating in a buck operational mode. If the value of step 702 equals "yes", the method advances to step 704. Otherwise, the method advances to step 726.

At step 704, the microcontroller 380 executes a first buck mode monitoring application 602. After step 704, the method advances to step 706.

At step 706, the microcontroller 380 executes a first buck mode diagnostic handler application 604. After step 706, the method advances to step 708.

At step 708, the microcontroller 380 executes a second buck mode monitoring application 606. After step 708, the method advances to step 710.

At step 710, the microcontroller 380 executes a second buck mode diagnostic handler application 608. After step 710, the method advances to step 712.

At step 712, the microcontroller 380 executes a third buck mode monitoring application 610. After step 712, the method advances to step 720.

At step 720, the microcontroller 380 executes a third buck mode diagnostic handler application 612. After step 720, the method advances to step 722.

At step 722, the microcontroller 380 executes a fourth buck mode monitoring application 614. After step 722, the method advances to step 724.

At step 724, the microcontroller 380 executes a fourth buck mode diagnostic handler application 616. After step 724, the method advances to step 726.

At step 726, the microcontroller 380 makes a determination as to whether the DC-DC voltage converter 100 is operating in a boost operational mode. If the value of step 726 equals "yes", the method advances to step 728. Otherwise, the method returns to step 702.

At step 728, the microcontroller 380 executes a first boost mode monitoring application 618. After step 728, the method advances to step 730.

At step 730, the microcontroller 380 executes a first boost mode diagnostic handler application 620. After step 730, the method advances to step 732.

At step 732, the microcontroller 380 executes a second boost mode monitoring application 622. After step 732, the method advances to step 734.

At step 734, the microcontroller 380 executes a second boost mode diagnostic handler application 624. After step 734, the method advances to step 736.

At step 736, the microcontroller 380 executes a third boost mode monitoring application 626. After step 736, the method advances to step 738.

At step 738, the microcontroller 380 executes a third boost mode diagnostic handler application 628. After step 738, the method advances to step 750.

At step 750, the microcontroller 380 executes a fourth boost mode monitoring application 630. After step 750, the method advances to step 752.

At step 752, the microcontroller 380 executes a fourth boost mode diagnostic handler application 632. After step 752, the method advances to step 754.

At step 754, the microcontroller 380 executes a fifth boost mode monitoring application 634. After step 754, the method advances to step 756.

At step 756, the microcontroller 380 executes a fifth boost mode diagnostic handler application 636. After step 756, the method advances to step 758.

At step 758, the microcontroller 380 executes a sixth boost mode monitoring application 638. After step 758, the method advances to step 760.

At step 760, the microcontroller 380 executes a sixth boost mode diagnostic handler application 640. After step 760, the method returns to step 702.

Figure 7:
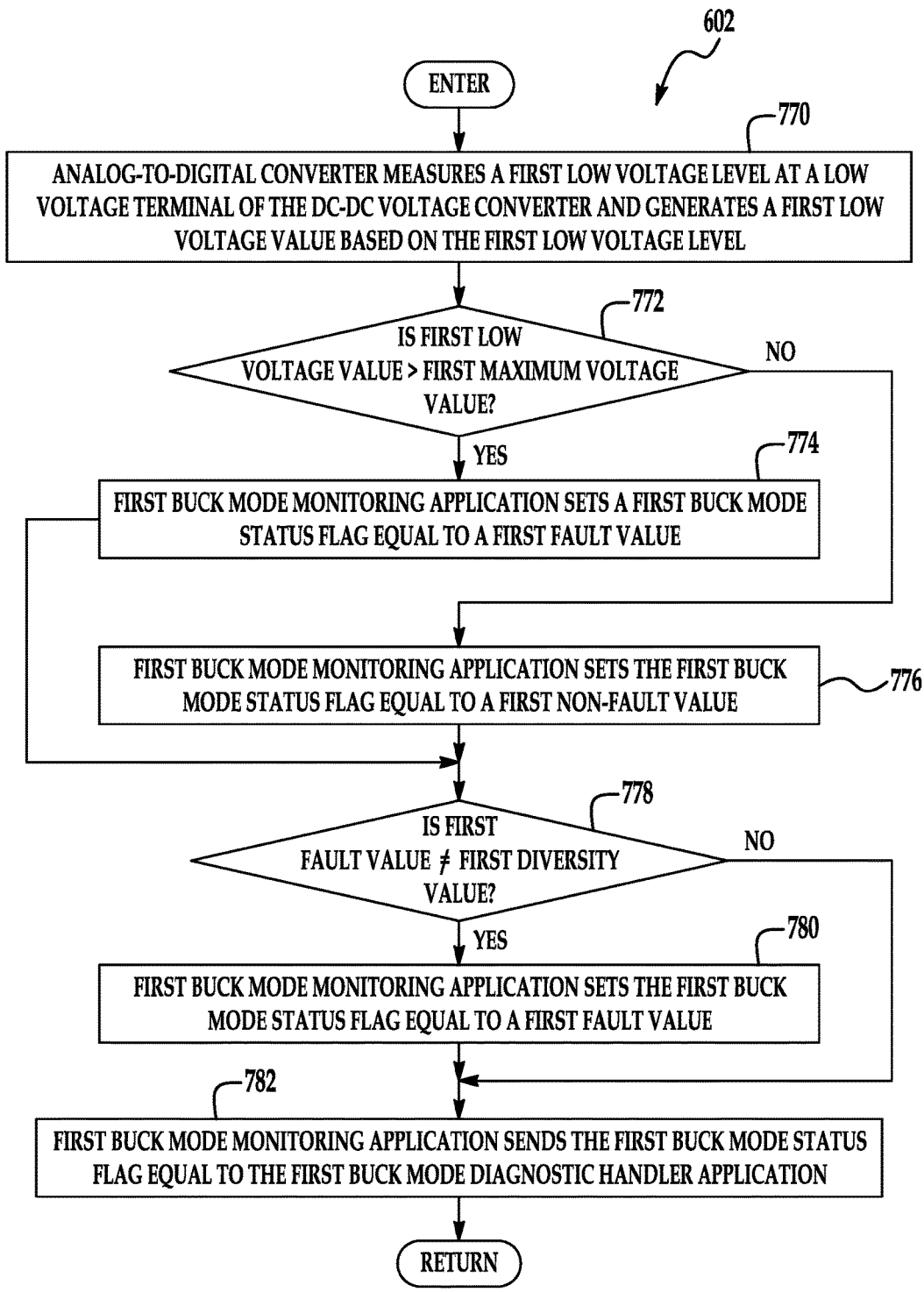
FIG. 7 is a flowchart of a first buck mode monitoring application utilized in the diagnostic system of FIG. 1.

Referring to FIG. 7, the first buck mode monitoring application 602 will now be explained. In particular, the first buck mode monitoring application 602 determines whether an overvoltage condition is detected at the low voltage terminal 264 during buck mode operation of the DC-DC voltage converter 100.

At step 770, the analog-to-digital converter 390 measures a first low voltage level at the low voltage terminal 264 of the DC-DC voltage converter 100 and generates a first low voltage value based on the first low voltage level. After step 770, the method advances to step 772.

At step 772, the first buck mode monitoring application 602 makes a determination as to whether the first low voltage value is greater than a first maximum voltage value. If the value of step 772 equals "yes", the method advances to step 774. Otherwise, the method advances to step 776.

At step 774, the first buck mode monitoring application 602 sets a first buck mode status flag equal to a first fault value (e.g., 7B shown in record 502 of the buck mode table 500 in FIG. 2). After step 774, the method advances to step 778.

Referring again to step 772, if the value of step 772 equals "no", the method advances to step 776. At step 776, the first buck mode monitoring application 602 sets the first buck mode status flag equal to a first non-fault value (e.g., B7 shown in record 502 of the buck mode table 500 in FIG. 2). After step 776, the method advances to step 778.

At step 778, the first buck mode monitoring application 602 makes a determination as to whether the first fault value is not equal to a first diversity value. If the value of step 778 equals "yes", the method advances to step 780. Otherwise, the method advances to step 782.

At step 780, the first buck mode monitoring application 602 sets the first buck mode status flag equal to a first fault value. After step 780, the method advances to step 782.

At step 782, the first buck mode monitoring application 602 sends the first buck mode status flag to the first buck mode diagnostic handler application 604. After step 782, the first buck mode monitoring application 602 returns to the main application 600.

Figures 8, 9:
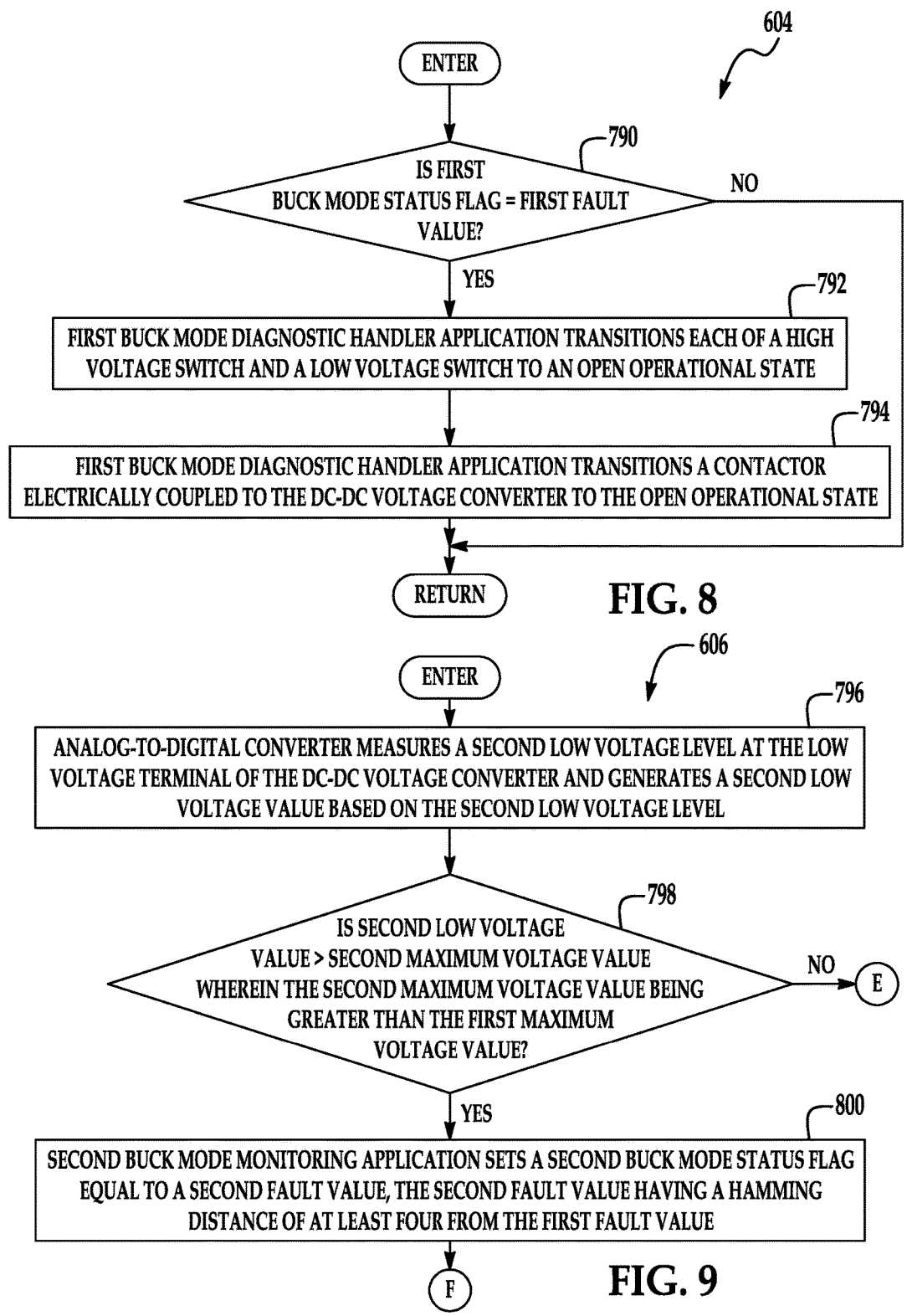
FIG. 8 is a flowchart of a first buck mode diagnostic handler application utilized in the diagnostic system of FIG. 1.
FIGS. 9-10 is a flowchart of a second buck mode monitoring application utilized in the diagnostic system of FIG. 1.

Referring to FIG. 8, the first buck mode diagnostic handler application 604 will now be explained.

At step 790, the first buck mode diagnostic handler application 604 makes a determination as to whether the first buck mode status flag is equal to a first fault value (e.g., 7B shown in record 502 of the buck mode table 500 in FIG. 2). If the value of step 790 equals "yes", the method advances to step 792. Otherwise, the method returns to the main application 600.

At step 792, the first buck mode diagnostic handler application 604 transitions each of the high voltage switch 250 and the low voltage switch 254 to an open operational state. After step 792, the method advances to step 794.

At step 794, the first buck mode diagnostic handler application 604 transitions the contactor 70 electrically coupled to the DC-DC voltage converter 100 to the open operational state. After step 794, the first buck mode diagnostic handler application 604 returns to the main application 600.

Figure 10:
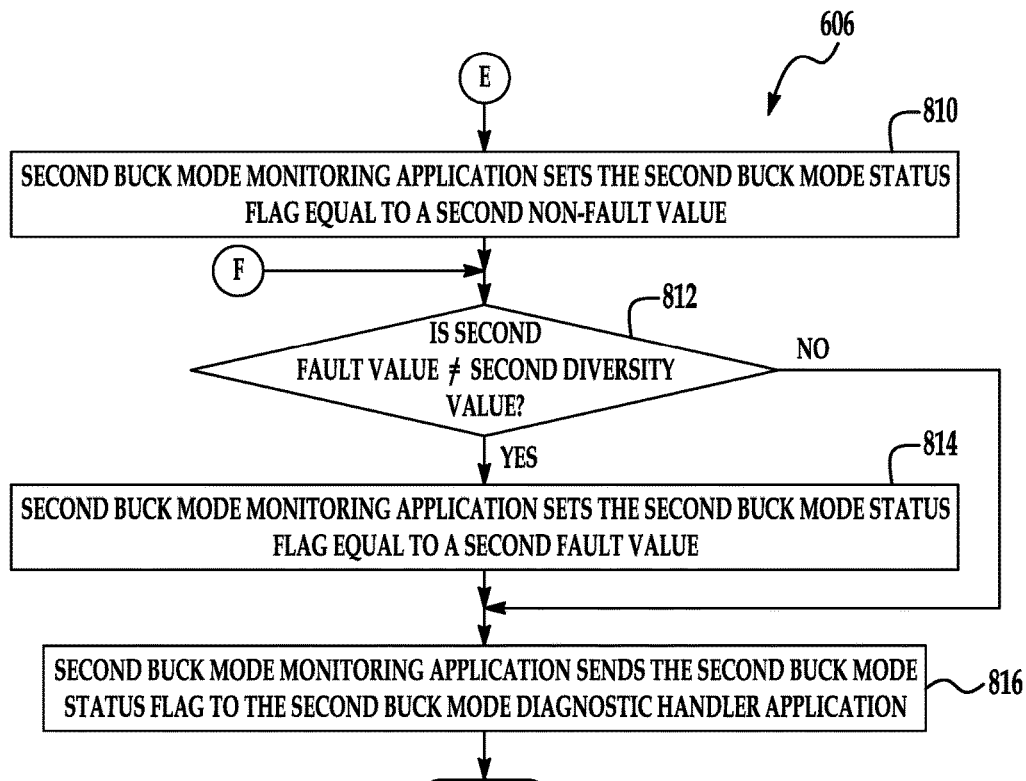

Referring to FIGS. 9 and 10, the second buck mode monitoring application 606 will now be explained. In particular, the second buck mode monitoring application 606 determines whether an overvoltage condition is detected at the low voltage terminal 264 during buck mode operation of the DC-DC voltage converter 100.

At step 796, the analog-to-digital converter 390 measures a second low voltage level at the low voltage terminal 264 of the DC-DC voltage converter 100 and generates a second low voltage value based on the second low voltage level. After step 796, the method advances to step 798.

At step 798, the second buck mode monitoring application 606 makes a determination as to whether the second low voltage value is greater than a second maximum voltage value, wherein the second maximum voltage value is greater than the first maximum voltage value. If the value of step 798 equals "yes", the method advances to step 800. Otherwise, the method advances to step 810.

At step 800, the second buck mode monitoring application 606 sets a second buck mode status flag equal to a second fault value (e.g., B7 shown in record 504 of the buck mode table 500 in FIG. 2). The second fault value has a Hamming distance of at least four from the first fault value. After step 800, the method advances to step 812.

Referring again to step 798, if the value of step 798 equals "no", the method advances to step 810. At step 810, the second buck mode monitoring application 606 sets the second buck mode status flag equal to a second non-fault value (e.g., 7B shown in record 504 of the buck mode table 500 in FIG. 2). After step 810, the method advances to step 812.

At step 812, the second buck mode monitoring application 606 makes a determination as to whether the second fault value is not equal to a second diversity value. If the value of step 812 equals "yes", the method advances to step 814. Otherwise, the method advances to step 816.

At step 814, the second buck mode monitoring application 606 sets the second buck mode status flag equal to the second fault value. After step 814, the method advances to step 816.

At step 816, the second buck mode monitoring application 606 sends the second buck mode status flag to the second buck mode diagnostic handler application 608. After step 816, the second buck mode monitoring application 606 returns to the main application 600.

Figure 11:
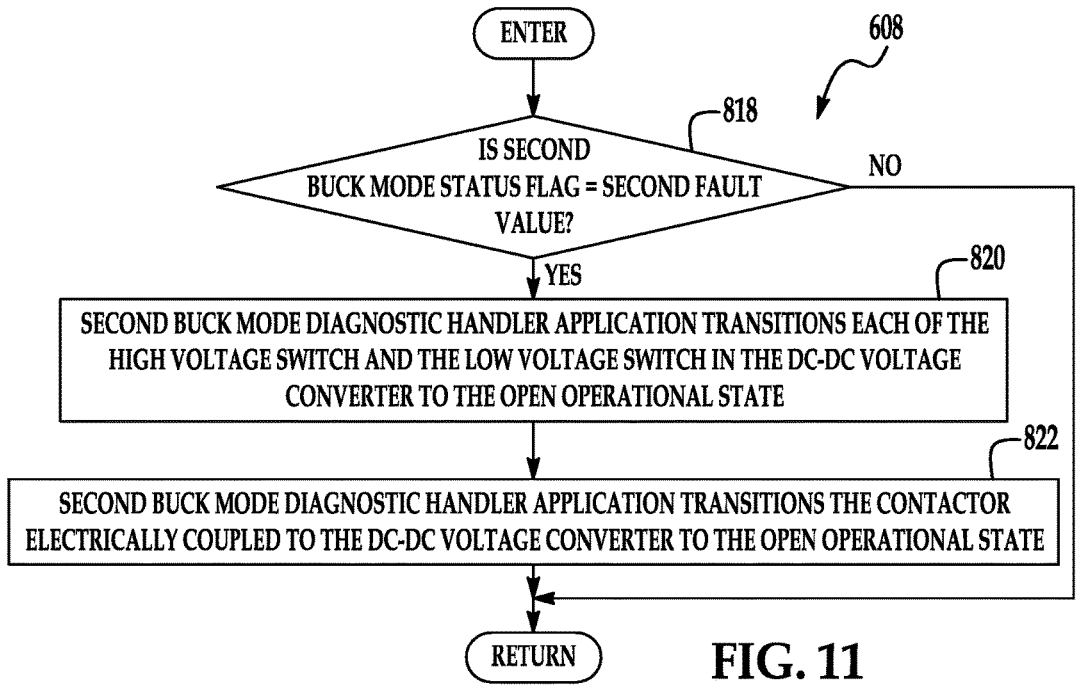
FIG. 11 is a flowchart of a second buck mode diagnostic handler application utilized in the diagnostic system of FIG. 1.

Referring to FIG. 11, the second buck mode diagnostic handler application 608 will now be explained.

At step 818, the second buck mode diagnostic handler application 608 makes a determination as to whether the second buck mode status flag is equal to the second fault value (e.g., B7 shown in record 504 of the buck mode table 500 in FIG. 2). If the value of step 818 equals "yes", the method advances to step 820. Otherwise, the method returns to the main application 600.

At step 820, the second buck mode diagnostic handler application 608 transitions each of the high voltage switch 250 and the low voltage switch 254 in the DC-DC voltage converter 100 to the open operational state. After step 820, the method advances to step 822.

At step 822, the second buck mode diagnostic handler application 608 transitions the contactor 70 electrically coupled to the DC-DC voltage converter 100 to the open operational state. After step 822, the method returns to the main application 600.

Figure 12:
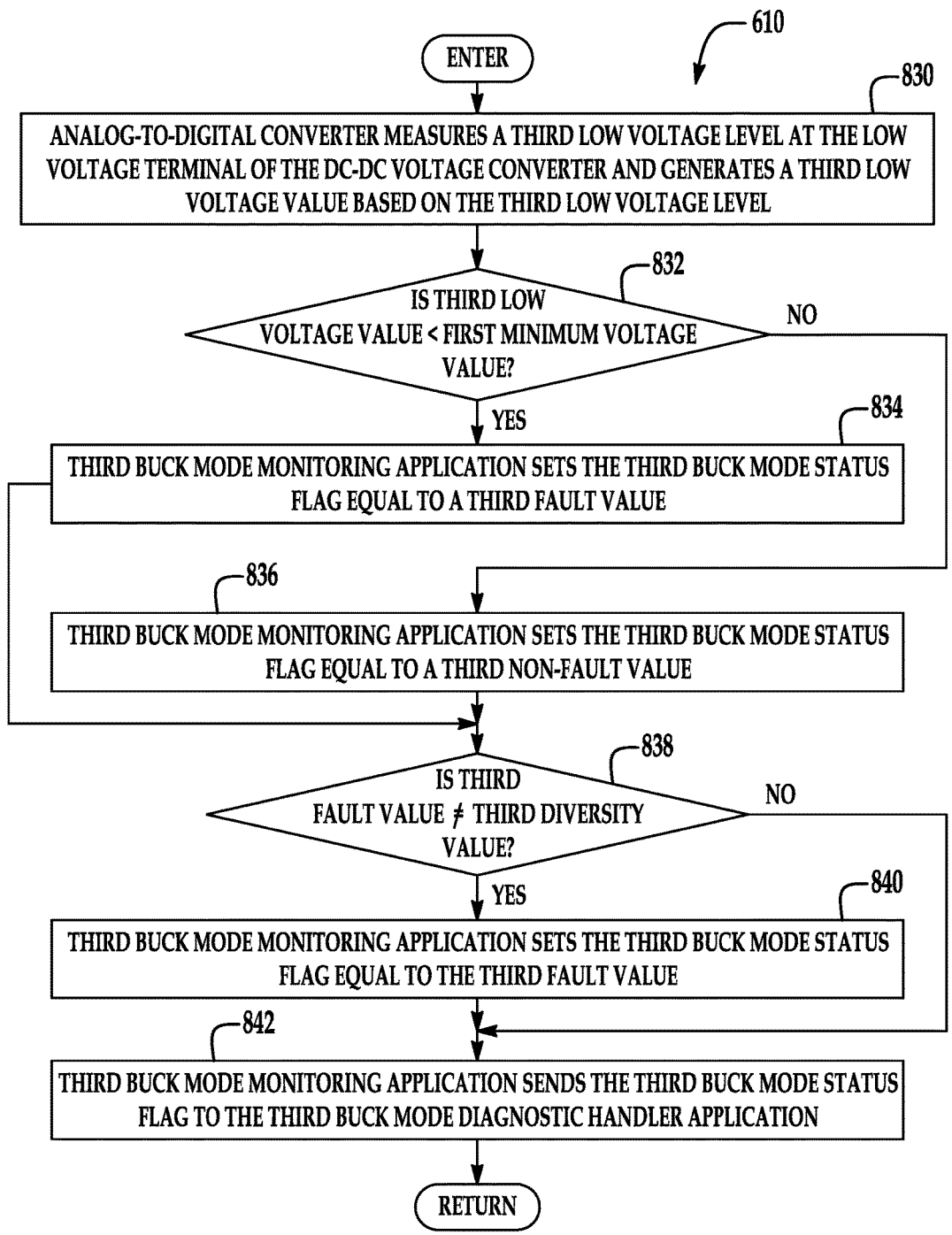
FIG. 12 is a flowchart of a third buck mode monitoring application utilized in the diagnostic system of FIG. 1.

Referring to FIG. 12, the third buck mode monitoring application 610 will now be explained. In particular, the third buck mode monitoring application 610 determines whether an undervoltage condition is detected at the low voltage terminal 264 during buck mode operation of the DC-DC voltage converter 100.

At step 830, the analog-to-digital converter 390 measures a third low voltage level at the low voltage terminal 264 of the DC-DC voltage converter 100 and generates a third low voltage value based on the third low voltage level. After step 830, the method advances to step 832.

At step 832, the third buck mode monitoring application 610 makes a determination as to whether the third low voltage value is less than a first minimum voltage value. If the value of step 832 equals "yes", the method advances to step 834. Otherwise, the method advances to step 836.

At step 834, the third buck mode monitoring application 610 sets a third buck mode status flag equal to a third fault value (e.g., CD shown in record 506 of the buck mode table 500 in FIG. 2). After step 834, the method advances to step 838.

Referring again to step 832, if the value of step 832 equals "no", the method advances to step 836. At step 836, the third buck mode monitoring application 610 sets the third buck mode status flag equal to a third non-fault value (e.g., DC shown in record 506 of the buck mode table 500 in FIG. 2). After step 836, the method advances to step 838.

At step 838, the third buck mode monitoring application 610 makes a determination as to whether the third fault value is not equal to a third diversity value. If the value of step 838 equals "yes", the method advances to step 840. Otherwise, the method advances to step 842.

At step 840, the third buck mode monitoring application 610 sets the third buck mode status flag equal to the third fault value (e.g., CD shown in record 506 of the buck mode table 500 in FIG. 2). After step 840, the method advances to step 842.

At step 842, the third buck mode monitoring application 610 sends the third buck mode status flag to the third buck mode diagnostic handler application 612. After step 842, the third buck mode monitoring application 610 returns to the main application 600.

Figure 13:
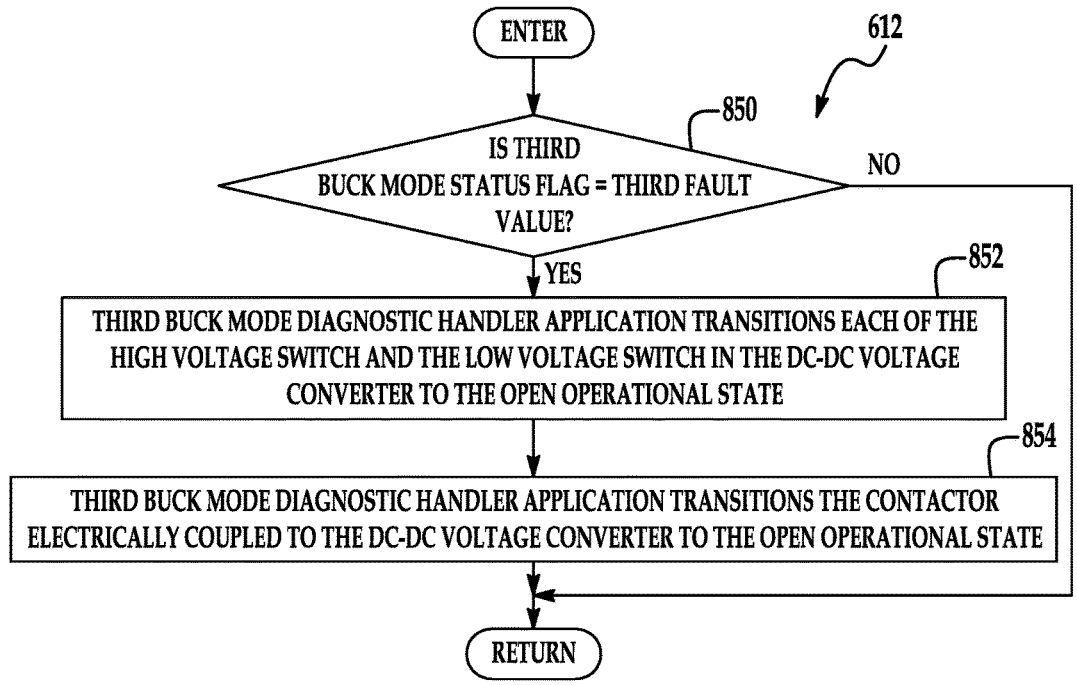
FIG. 13 is a flowchart of a third buck mode diagnostic handler application utilized in the diagnostic system of FIG. 1.

Referring to FIG. 13, the third buck mode diagnostic handler application 612 will now be explained.

At step 850, the third buck mode diagnostic handler application 612 makes a determination as to whether the third buck mode status flag is equal to the third fault value (e.g., CD shown in record 506 of the buck mode table 500 in FIG. 2). If the value of step 850 equals "yes", the method advances to step 852. Otherwise, the method returns to the main application 600.

At step 852, the third buck mode diagnostic handler application 612 transitions each of the high voltage switch 250 and the low voltage switch 254 in the DC-DC voltage converter 100 to the open operational state. After step 852, the method advances to step 854.

At step 854, the third buck mode diagnostic handler application 612 transitions the contactor 70 electrically coupled to the DC-DC voltage converter 100 to the open operational state. After step 854, the method returns to the main application 600.

Figure 14:
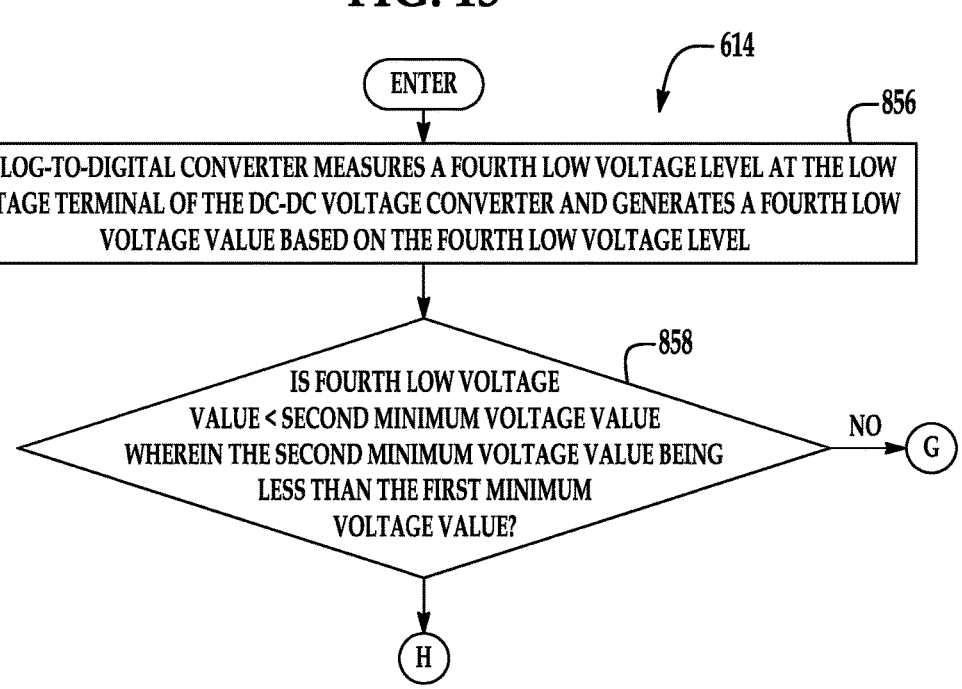
FIGS. 14-15 is a flowchart of a fourth buck mode monitoring application utilized in the diagnostic system of FIG. 1.
Figure 15:
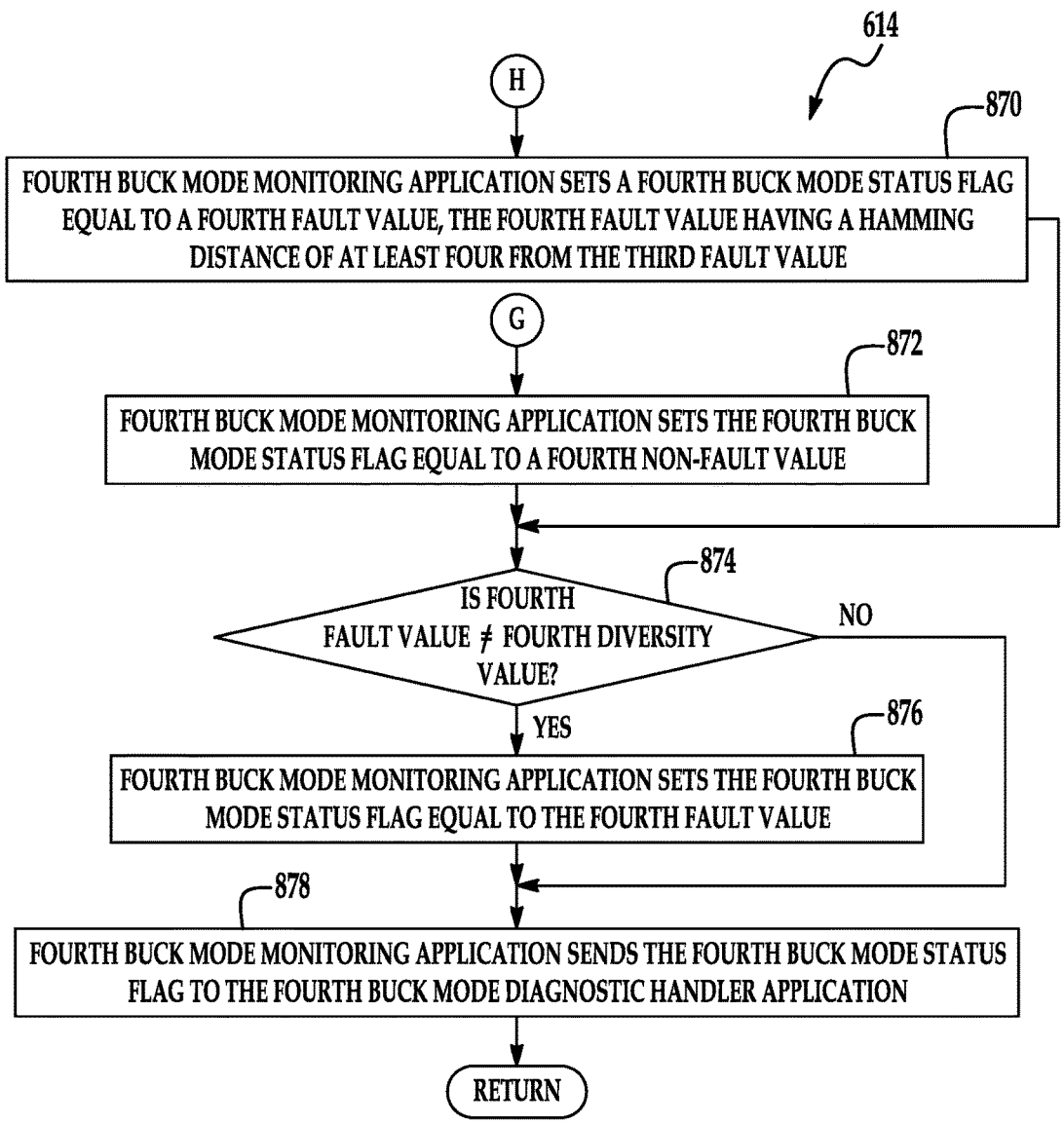

Referring to FIGS. 14 and 15, the fourth buck mode monitoring application 614 will now be explained. In particular, the fourth buck mode monitoring application 614 determines whether an undervoltage condition is detected at the low voltage terminal 264 during buck mode operation of the DC-DC voltage converter 100.

At step 856, the analog-to-digital converter 390 measures a fourth low voltage level at the low voltage terminal 264 of the DC-DC voltage converter 100 and generates a fourth low voltage value based on the fourth low voltage level. After step 856, the method advances to step 858.

At step 858, the fourth buck mode monitoring application 614 makes a determination as to whether the fourth low voltage value is less than a second minimum voltage value, wherein the second minimum voltage value is less than the first minimum voltage value. If the value of step 858 equals "yes", the method advances to step 870. Otherwise, the method advances to step 872.

At step 870, the fourth buck mode monitoring application 614 sets a fourth buck mode status flag equal to a fourth fault value (e.g., DC shown in record 508 of the buck mode table 500 in FIG. 2). The fourth fault value has a Hamming distance of at least four from the third fault value. After step 870, the method advances to step 874.

Referring again to step 858, if the value of step 858 equals "no", the method advances to step 872. At step 872, the fourth buck mode monitoring application 614 sets the fourth buck mode status flag equal to a fourth non-fault value (e.g., CD shown in record 508 of the buck mode table 500 in FIG. 2). After step 872, the method advances to step 874.

At step 874, the fourth buck mode monitoring application 614 makes a determination as to whether the fourth fault value is not equal to a fourth diversity value. If the value of step 874 equals "yes", the method advances to step 876. Otherwise, method advances to step 878.

At step 876, the fourth buck mode monitoring application 614 sets the fourth buck mode status flag equal to the fourth fault value (e.g., DC shown in record 508 of the buck mode table 500 in FIG. 2). After step 876, the method advances to step 878.

At step 878, the fourth buck mode monitoring application 614 sends the fourth buck mode status flag to the fourth buck mode diagnostic handler application 616. After step 878, the method returns to the main application 600.

Figure 16:
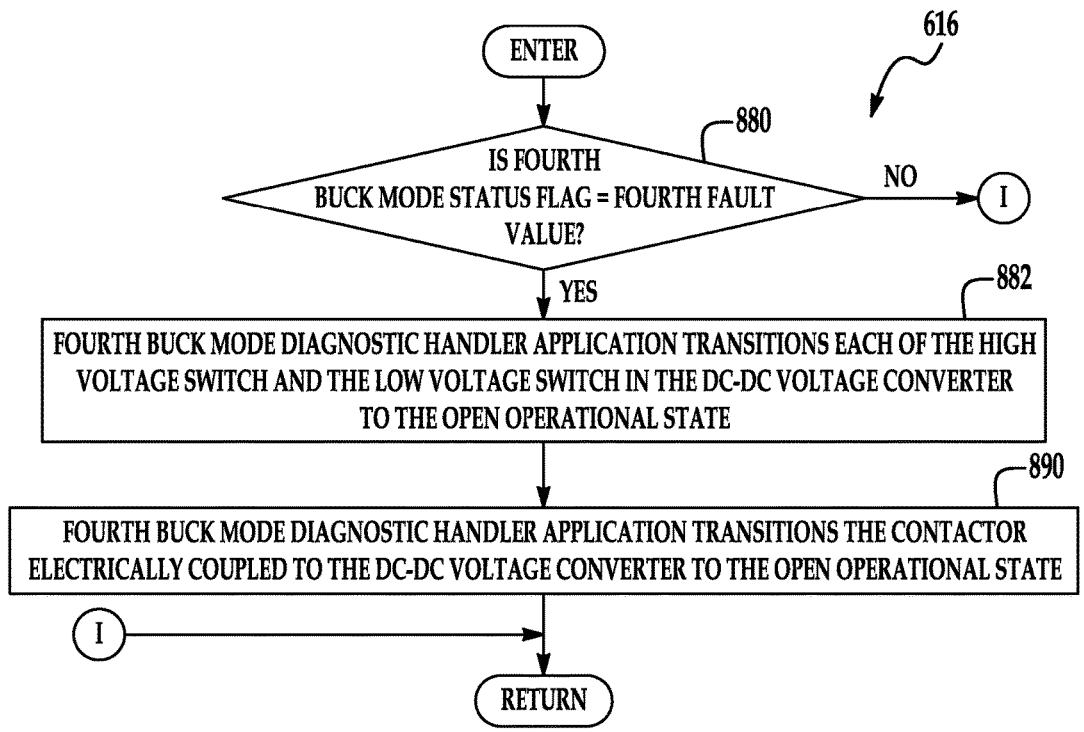
FIG. 16 is a flowchart of a fourth buck mode diagnostic handler application utilized in the diagnostic system of FIG. 1.

Referring to FIG. 16, the fourth buck mode diagnostic handler application 616 will now be explained.

At step 880, the fourth buck mode diagnostic handler application 616 makes a determination as to whether the fourth buck mode status flag is equal to the fourth fault value (e.g., DC shown in record 508 of the buck mode table 500 in FIG. 2). If the value of step 880 equals "yes", the method advances to step 882. Otherwise, the method returns to the main application 600.

At step 882, the fourth buck mode diagnostic handler application 616 transitions each of the high voltage switch 250 and the low voltage switch 254 in the DC-DC voltage converter 100 to the open operational state. After step 882, the method advances to step 890.

At step 890, the fourth buck mode diagnostic handler application 616 transitions the contactor 70 electrically coupled to the DC-DC voltage converter 100 to the open operational state. After step 890, the method returns to the main application 600.

Figure 17:
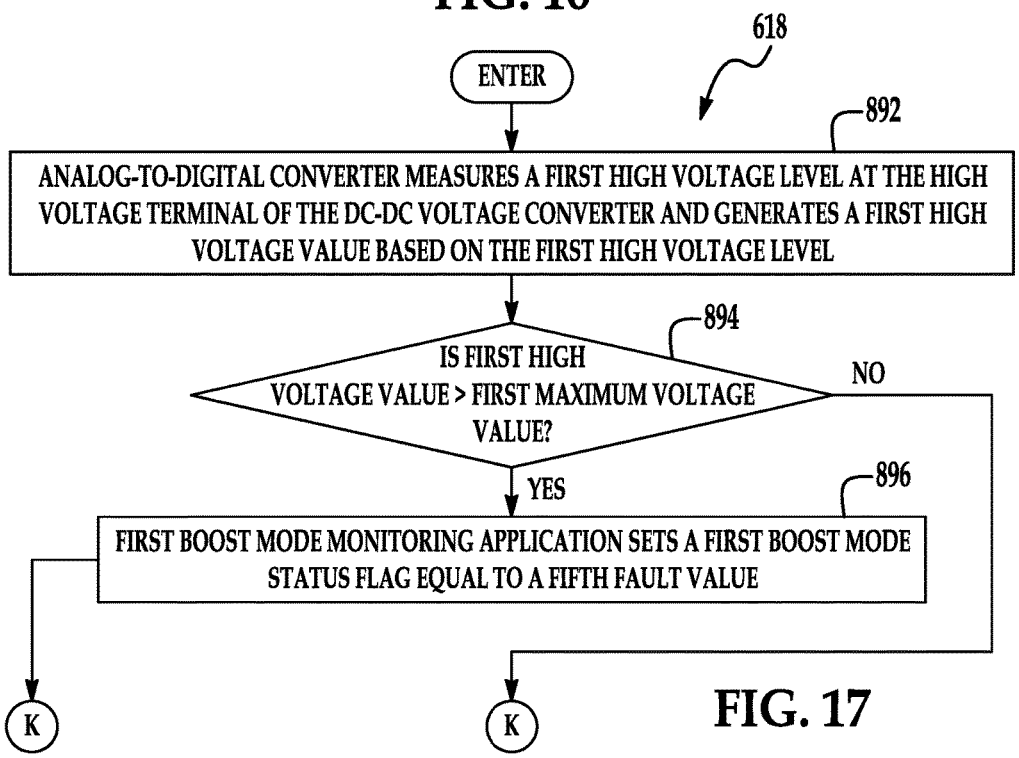
FIGS. 17-18 is a flowchart of a first boost mode monitoring application utilized in the diagnostic system of FIG. 1.
Figure 18:
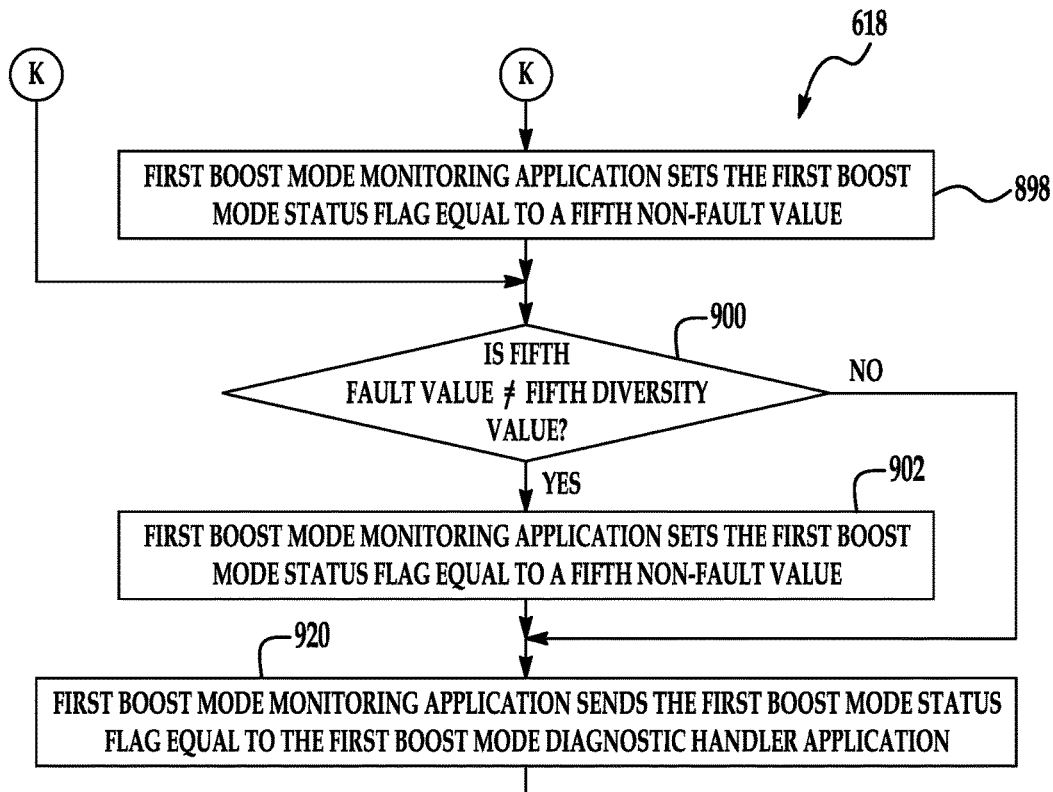

Referring to FIGS. 17 and 18, the first boost mode monitoring application 618 will now be explained. In particular, the first boost mode monitoring application 618 determines whether an overvoltage condition is detected at the high voltage terminal 262 during boost mode operation of the DC-DC voltage converter 100.

At step 892, the analog-to-digital converter 390 measures a first high voltage level at the high voltage terminal 262 of the DC-DC voltage converter 100 and generates a first high voltage value based on the first high voltage level. After step 892, the method advances to step 894.

At step 894, the first boost mode monitoring application 618 makes a determination as to whether the first high voltage value is greater than a first maximum voltage value. If the value of step 894 equals "yes", the method advances to step 896. Otherwise, the method advances to step 898.

At step 896, the first boost mode monitoring application 618 sets a first boost mode status flag equal to a fifth fault value (e.g., 41 shown in record 552 of the boost mode table 550 in FIG. 3). After step 896, the method advances to step 900.

Referring again to step 894, if the value of step 894 equals "no", the method advances to step 898. At step 898, the first boost mode monitoring application 618 sets the first boost mode status flag equal to a fifth non-fault value (e.g., 14 shown in record 552 of the boost mode table 550 in FIG. 3. After step 898, the method advances to step 900.

At step 900, the first boost mode monitoring application 618 makes a determination as to whether the fifth fault value is not equal to a fifth diversity value. If the value of step 900 equals "yes", the method advances to step 902. Otherwise, the method advances to step 920.

At step 902, the first boost mode monitoring application 618 sets the first boost mode status flag equal to the fifth fault value (e.g., 41 shown in record 552 of the boost mode table 550 in FIG. 3). After step 902, the method advances to step 920.

At step 920, the first boost mode monitoring application 618 sends the first boost mode status flag to the first boost mode diagnostic handler application 620. After step 920, the method returns to the main application 600.

Figure 19:
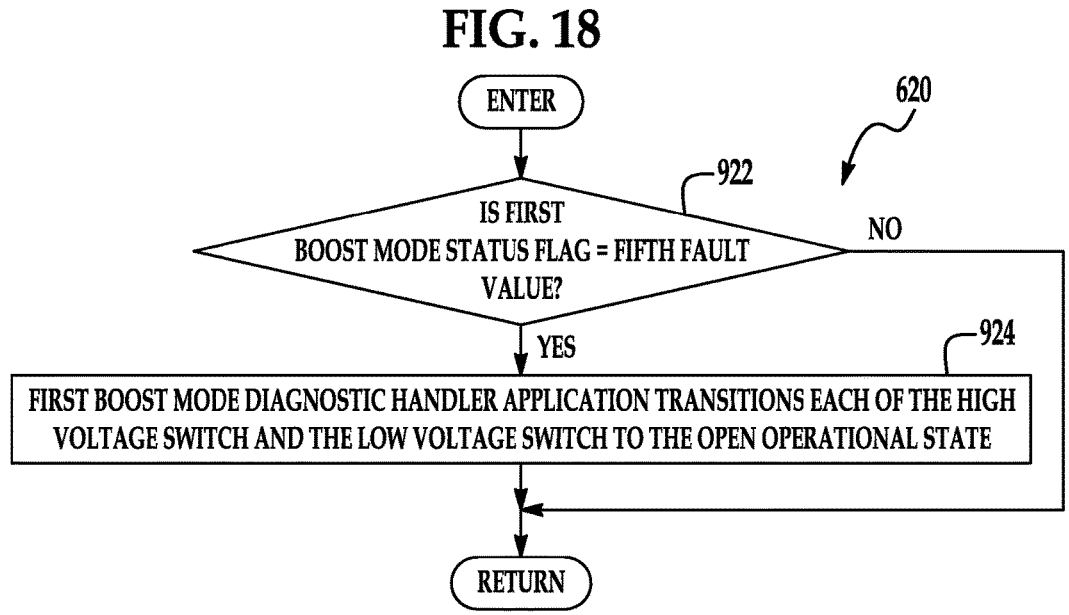
FIG. 19 is a flowchart of a first boost mode diagnostic handler application utilized in the diagnostic system of FIG. 1.

Referring to FIG. 19, the first boost mode diagnostic handler application 620 will now be explained.

At step 922, the first boost mode diagnostic handler application 620 makes a determination as to whether the first boost mode status flag is equal to the fifth fault value (e.g., 41 shown in record 552 of the boost mode table 550 in FIG. 3). If the value of step 922 equals "yes", the method advances to step 924. Otherwise, the method returns to the main application 600.

At step 924, the first boost mode diagnostic handler application 620 transitions each of the high voltage switch 250 and the low voltage switch 254 to the open operational state. After step 924, the method returns to the main application 600.

Figure 20:
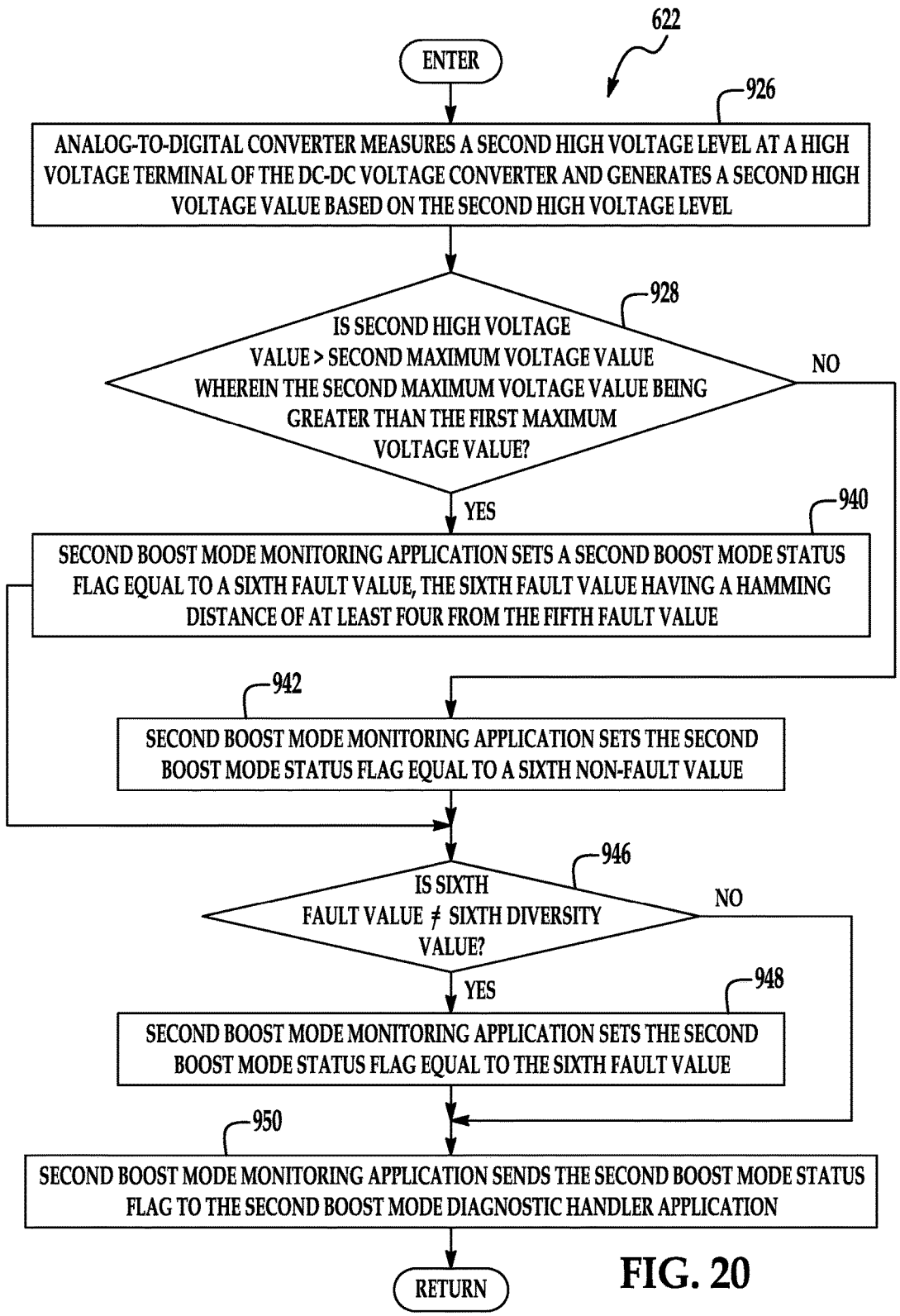
FIG. 20 is a flowchart of a second boost mode monitoring application utilized in the diagnostic system of FIG. 1.

Referring to FIG. 20, the second boost mode monitoring application 622 will now be explained. In particular, the second boost mode monitoring application 622 determines whether an overvoltage condition is detected at the high voltage terminal 262 during boost mode operation of the DC-DC voltage converter 100.

At step 926, the analog-to-digital converter 390 measures a second high voltage level at the high voltage terminal 262 of the DC-DC voltage converter 100 and generates a second high voltage value based on the second high voltage level. After step 926, the method advances to step 928.

At step 928, the second boost mode monitoring application 622 makes a determination as to whether the second high voltage value is greater than a second maximum voltage value, wherein the second maximum voltage value is greater than the first maximum voltage value. If the value of step 928 equals "yes", the method advances to step 940. Otherwise, the method advances to step 942.

At step 940, the second boost mode monitoring application 622 sets a second boost mode status flag equal to a sixth fault value (e.g., 14 shown in record 554 of the boost mode table 550 in FIG. 3). The sixth fault value has a Hamming distance of at least four from the fifth fault value. After step 940, the method advances to step 946.

Referring again to step 928, if the value of step 928 equals "no", the method advances to step 942. At step 942, the second boost mode monitoring application 622 sets the second boost mode status flag equal to a sixth non-fault value (e.g., 41 shown in record 554 of the boost mode table 550 in FIG. 3). After step 942, the method advances to step 946.

At step 946, the second boost mode monitoring application 622 makes a determination as to whether the sixth fault value is not equal to a sixth diversity value. If the value of step 946 equals "yes", the method advances to step 948. Otherwise, the method returns to the main application 600.

At step 948, the second boost mode monitoring application 622 sets the second boost mode status flag equal to the sixth fault value (e.g., 14 shown in record 554 of the boost mode table 550 in FIG. 3). After step 948, the method advances to step 950.

At step 950, the second boost mode monitoring application 622 sends the second boost mode status flag to the second boost mode diagnostic handler application 624. After step 950, the method returns to the main application 600.

Figure 21:
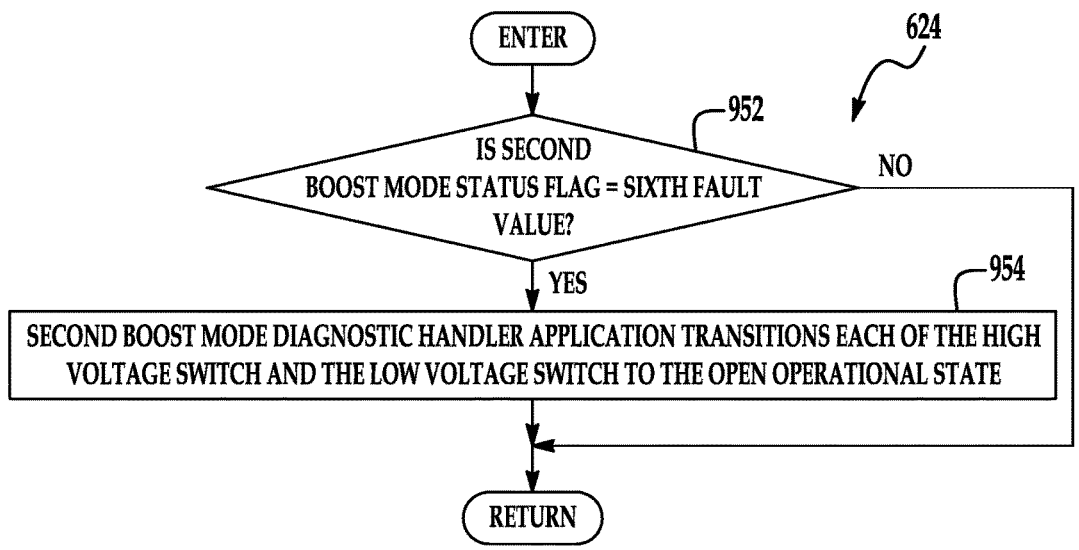
FIG. 21 is a flowchart of a second boost mode diagnostic handler application utilized in the diagnostic system of FIG. 1.

Referring to FIG. 21, the second boost mode diagnostic handler application 624 will now be explained.

At step 952, the second boost mode diagnostic handler application 624 makes a determination as to whether the second boost mode status flag is equal to the sixth fault value (e.g., 14 shown in record 554 of the boost mode table 550 in FIG. 3). If the value of step 952 equals "yes", the method advances to step 954. Otherwise, the method returns to the main application 600.

At step 954, the second boost mode diagnostic handler application 624 transitions each of the high voltage switch 250 and the low voltage switch 254 to the open operational state. After step 954, the method returns to the main application 600.

Figure 22:
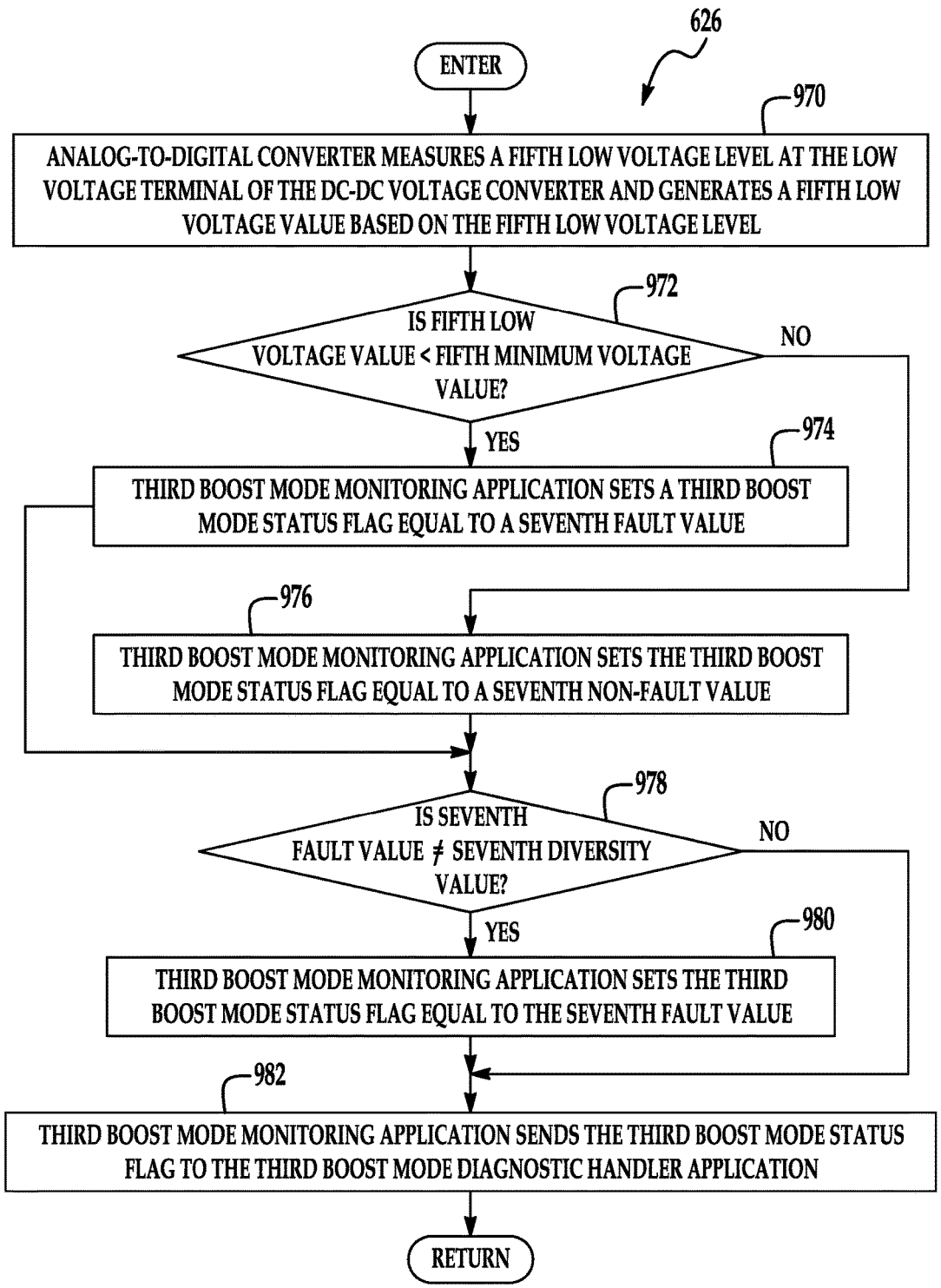
FIG. 22 is a flowchart of a third boost mode monitoring application utilized in the diagnostic system of FIG. 1.

Referring to FIG. 22, the third boost mode monitoring application 626 will now be explained. In particular, the third boost mode monitoring application 626 determines whether an undervoltage condition is detected at the low voltage terminal 264 during boost mode operation of the DC-DC voltage converter 100.

At step 970, the analog-to-digital converter 390 measures a fifth low voltage level at the low voltage terminal 264 of the DC-DC voltage converter 100 and generates a fifth low voltage value based on the fifth low voltage level. After step 970, the method advances to step 972.

At step 972, the third boost mode monitoring application 626 makes a determination as to whether the fifth low voltage value is less than a fifth minimum voltage value. If the value of step 972 equals "yes", the method advances to step 974. Otherwise, the method advances to step 976.

At step 974, the third boost mode monitoring application 626 sets a third boost mode status flag equal to a seventh fault value (e.g., DC shown in record 556 of the boost mode table 550 in FIG. 3). After step 974, the method advances to step 978.

Referring again to step 972, if the value of step 972 equals "no", the method advances to step 976. At step 976, the third boost mode monitoring application 626 sets the third boost mode status flag equal to a seventh non-fault value (e.g., CD shown in record 556 of the boost mode table 550 in FIG. 3). After step 976, the method advances to step 978.

At step 978, the third boost mode monitoring application 626 makes a determination as to whether the seventh fault value is not equal to a seventh diversity value. If the value of step 978 equals "yes", the method advances to step 980. Otherwise, the method advances to step 982.

At step 980, the third boost mode monitoring application 626 sets the third boost mode status flag equal to the seventh fault value (e.g., CD shown in record 556 of the boost mode table 550 in FIG. 3). After step 980, the method advances to step 982.

At step 982, the third boost mode monitoring application 626 sends the third boost mode status flag to the third boost mode diagnostic handler application 628. After step 982, the method returns to the main application 600.

Figure 23:
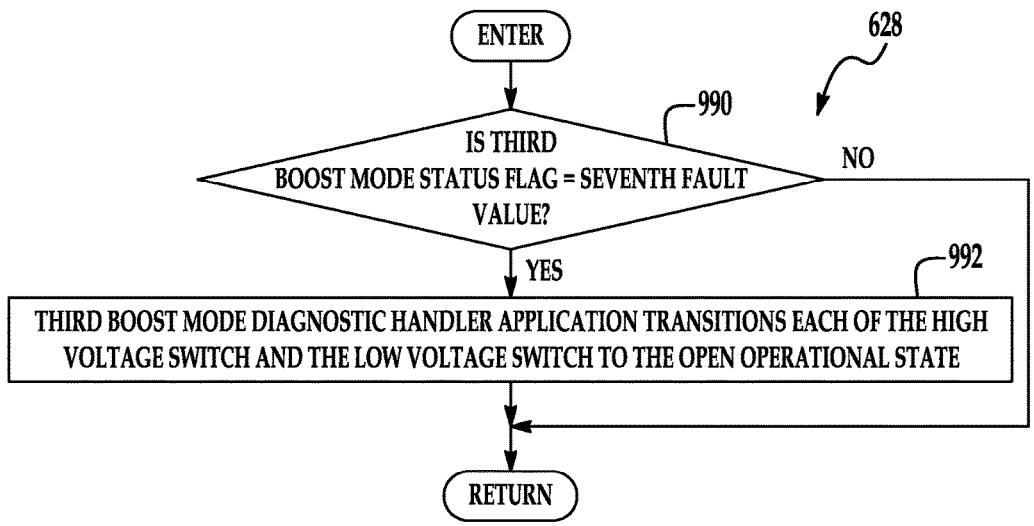
FIG. 23 is a flowchart of a third boost mode diagnostic handler application utilized in the diagnostic system of FIG. 1.

Referring to FIG. 23, the third boost mode diagnostic handler application 628 will now be explained.

At step 990, the third boost mode diagnostic handler application 628 makes a determination as to whether the third boost mode status flag is equal to a seventh fault value. If the value of step 990 equals "yes", the method advances to step 992. Otherwise, the method returns to the main application 600.

At step 992, the third boost mode diagnostic handler application 628 transitions each of the high voltage switch 250 and the low voltage switch 254 to the open operational state. After step 992, the method returns to the main application 600.

Figure 24:
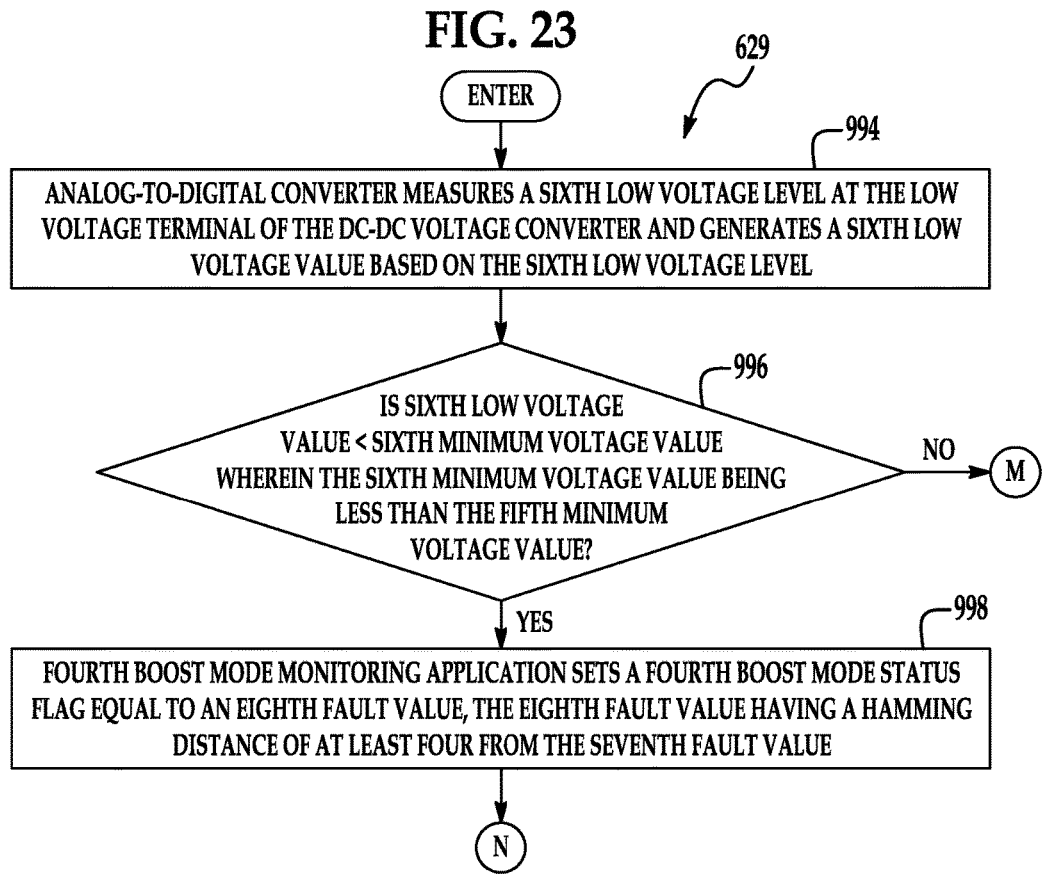
FIGS. 24-25 is a flowchart of a fourth boost mode monitoring application utilized in the diagnostic system of FIG. 1.
Figure 25:
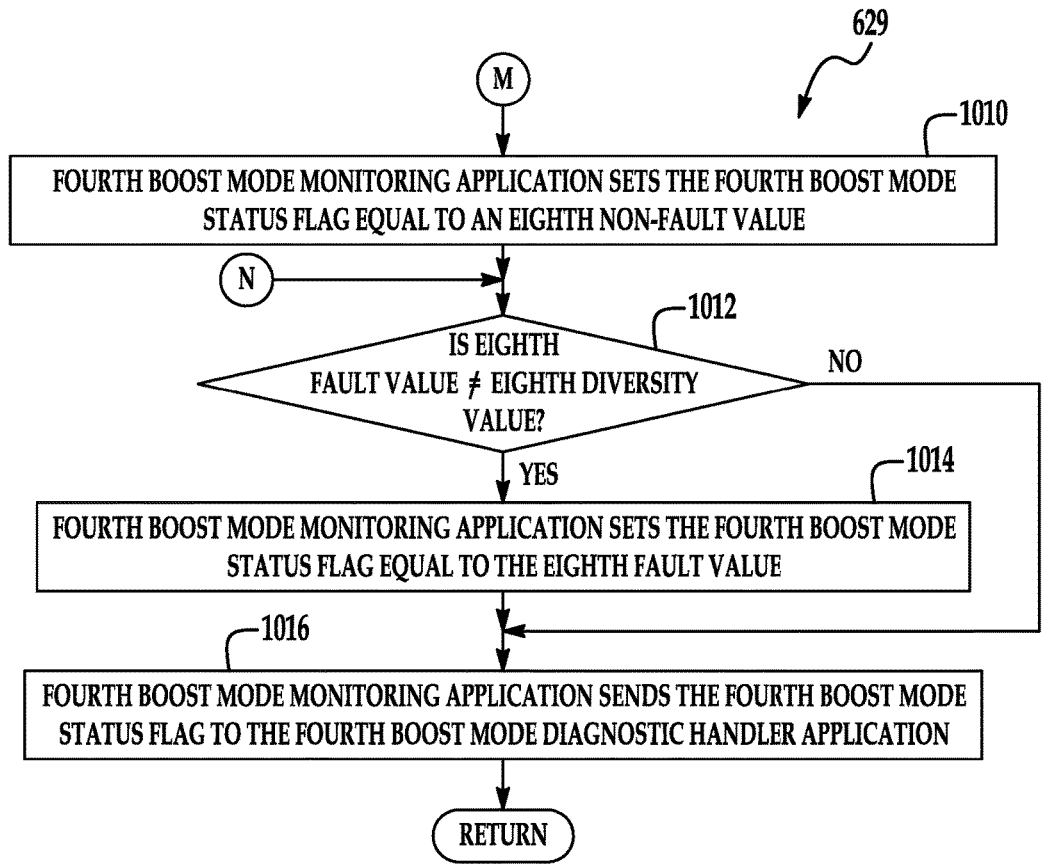

Referring to FIGS. 24 and 25, the fourth boost mode monitoring application 629 will now be explained. In particular, the fourth boost mode monitoring application 629 determines whether an undervoltage condition is detected at the low voltage terminal 264 during boost mode operation of the DC-DC voltage converter 100.

At step 994, the analog-to-digital converter 390 measures a sixth low voltage level at the low voltage terminal 264 of the DC-DC voltage converter 100 and generates a sixth low voltage value based on the sixth low voltage level. After step 994, the method advances to step 996.

At step 996, the fourth boost mode monitoring application 629 makes a determination as to whether the sixth low voltage value is less than a sixth minimum voltage value, wherein the sixth minimum voltage value is less than the fifth minimum voltage value. If the value of step 996 equals "yes", the method advances to step 998. Otherwise, the method advances to step 1010.

At step 998, the fourth boost mode monitoring application 629 sets a fourth boost mode status flag equal to an eighth fault value (e.g., CD shown in record 558 of the boost mode table 550 in FIG. 3). The eighth fault value has a Hamming distance of at least four from the seventh fault value. After step 998, the method advances to step 1010.

At step 1010, the fourth boost mode monitoring application 629 sets the fourth boost mode status flag equal to an eighth non-fault value (e.g., DC shown in record 558 of the boost mode table 550 in FIG. 3). After step 1010, the method advances to step 1012.

At step 1012, the fourth boost mode monitoring application 629 makes a determination as to whether the eighth fault value is not equal to a eighth diversity value. If the value of step 1012 equals "yes", the method advances to step 1014. Otherwise, the method advances to step 1016.

At step 1014, the fourth boost mode monitoring application 629 sets the fourth boost mode status flag equal to the eighth fault value (e.g., DC shown in record 558 of the boost mode table 550 in FIG. 3). After step 1014, the method advances to step 1016.

At step 1016, the fourth boost mode monitoring application 629 sends the fourth boost mode status flag to the fourth boost mode diagnostic handler application 630. After step 1016, the method returns to the main application 600.

Figure 26:
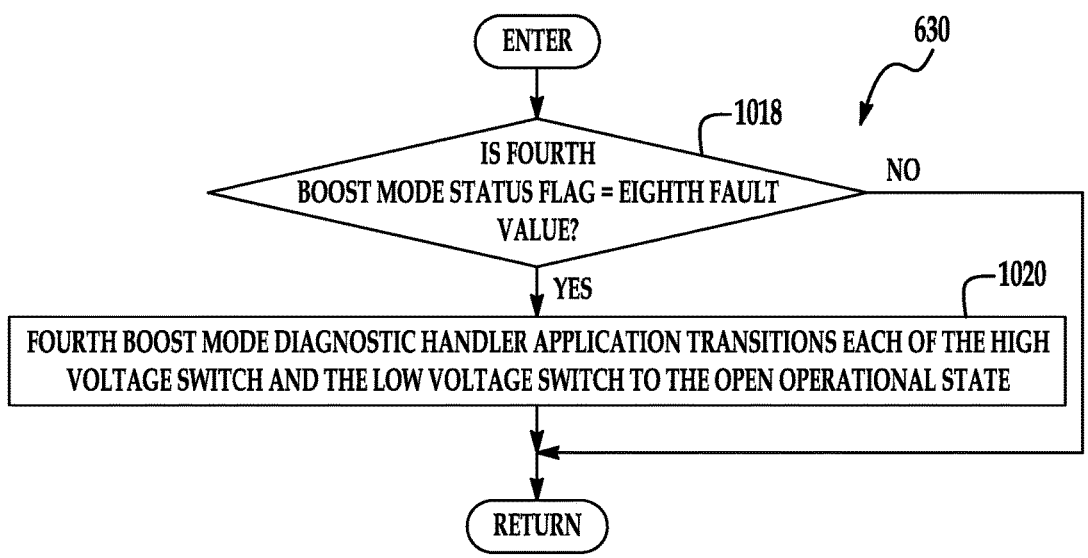
FIG. 26 is a flowchart of a fourth boost mode diagnostic handler application utilized in the diagnostic system of FIG. 1.

Referring to FIG. 26, the fourth boost mode diagnostic handler application 630 will now be explained.

At step 1018, the fourth boost mode diagnostic handler application 630 makes a determination as to whether the fourth boost mode status flag is equal to the eighth fault value (e.g., DC shown in record 558 of the boost mode table 550 in FIG. 3). If the value of step 1018 equals "yes", the method advances to step 1020. Otherwise, the method returns to the main application 600.

At step 1020, the fourth boost mode diagnostic handler application 630 transitions each of the high voltage switch 250 and the low voltage switch 254 to the open operational state. After step 1020, the method returns to the main application 600.

Figure 27:
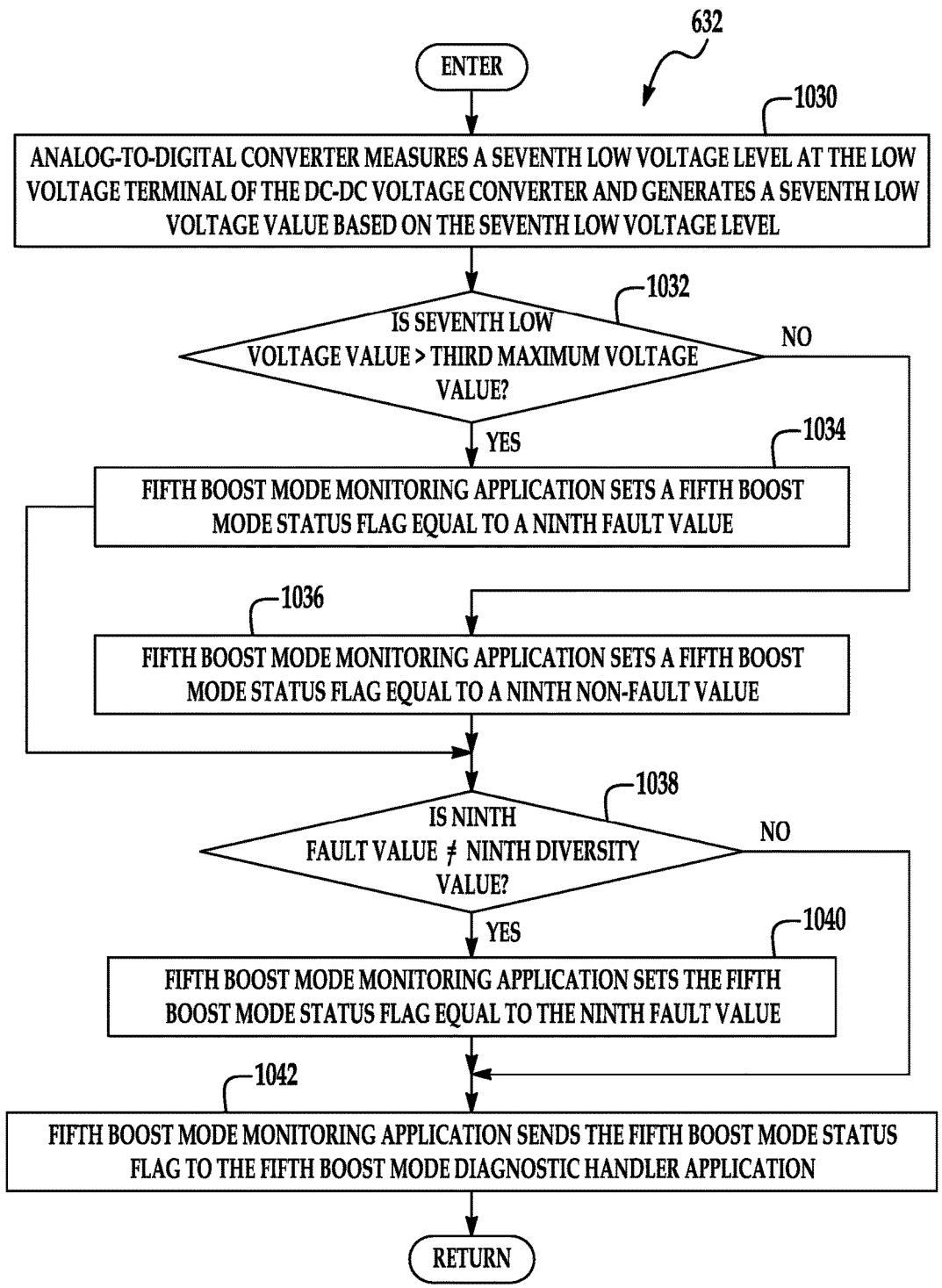
FIG. 27 is a flowchart of a fifth boost mode monitoring application utilized in the diagnostic system of FIG. 1.

Referring to FIG. 27, the fifth boost mode monitoring application 632 will be explained. In particular, the fifth boost mode monitoring application 632 determines whether an overvoltage condition is detected at the low voltage terminal 264 during boost mode operation of the DC-DC voltage converter 100.

At step 1030, the analog-to-digital converter 390 measures a seventh low voltage level at the low voltage terminal 264 of the DC-DC voltage converter 100 and generates a seventh low voltage value based on the seventh low voltage level. After step 1030, the method advances to step 1032.

At step 1032, the fifth boost mode monitoring application 632 makes a determination as to whether the seventh low voltage value is greater than a third maximum voltage value. If the value of step 1032 equals "yes", the method advances step 1034. Otherwise, the method advances to step 1036.

At step 1034, the fifth boost mode monitoring application 632 sets a fifth boost mode status flag equal to a ninth fault value (e.g., B7 shown in record 560 of the boost mode table 550 in FIG. 3). After step 1034, the method advances to step 1038.

Referring again to step 1032, if the value of step 1032 equals "no", the method advances to step 1036. At step 1036, the fifth boost mode monitoring application 632 sets the fifth boost mode status flag equal to a ninth non-fault value (e.g., 7B shown in record 560 of the boost mode table 550 in FIG. 3). After step 1036, the method advances to step 1038.

At step 1038, the fifth boost mode monitoring application 632 makes a determination as to whether the ninth fault value is not equal to a ninth diversity value. If the value of step 1038 equals "yes", the method advances to step 1040. Otherwise, the method advances to step 1042.

At step 1040, the fifth boost mode monitoring application 632 sets the fifth boost mode status flag equal to the ninth fault value. After step 1040, the method advances to step 1042.

At step 1042, the fifth boost mode monitoring application 632 sends the fifth boost mode status flag to the fifth boost mode diagnostic handler application 634. After step 1042, the method returns to the main application 600.

Figure 28:
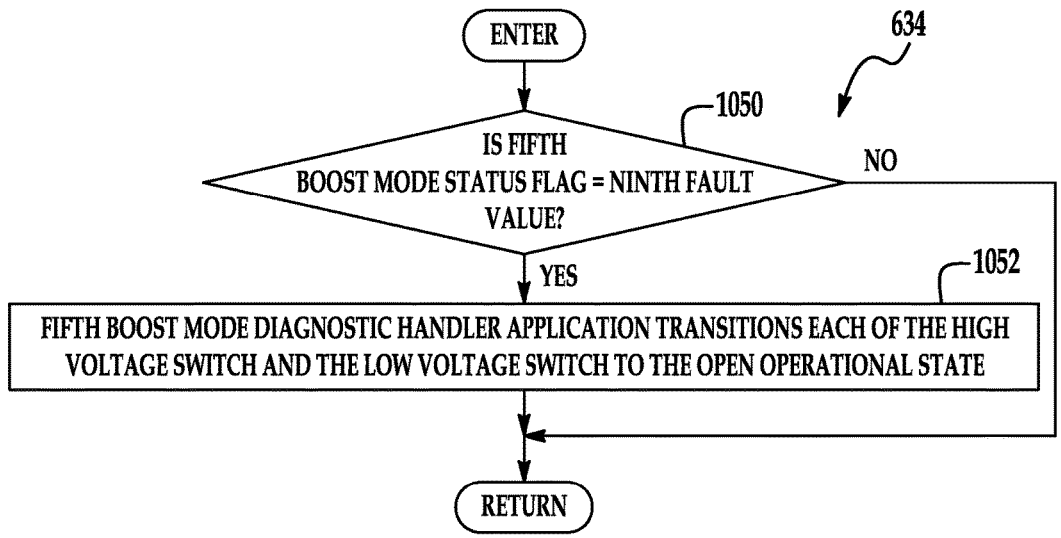
FIG. 28 is a flowchart of a fifth boost mode diagnostic handler application utilized in the diagnostic system of FIG. 1.

Referring to FIG. 28, the fifth boost mode diagnostic handler application 634 will now be explained.

At step 1050, the fifth boost mode diagnostic handler application 634 makes a determination as to whether the fifth boost mode status flag is equal to the ninth fault value (e.g., B7 shown in record 560 of the boost mode table 550 in FIG. 3). If the value of step 1050 equals "yes", the method advances to step 1052. Otherwise, the method returns to the main application 600.

At step 1052, the fifth boost mode diagnostic handler application 634 transitions each of the high voltage switch 250 and the low voltage switch 254 to the open operational state. After step 1052, the method returns to the main application 600.

Figure 29:
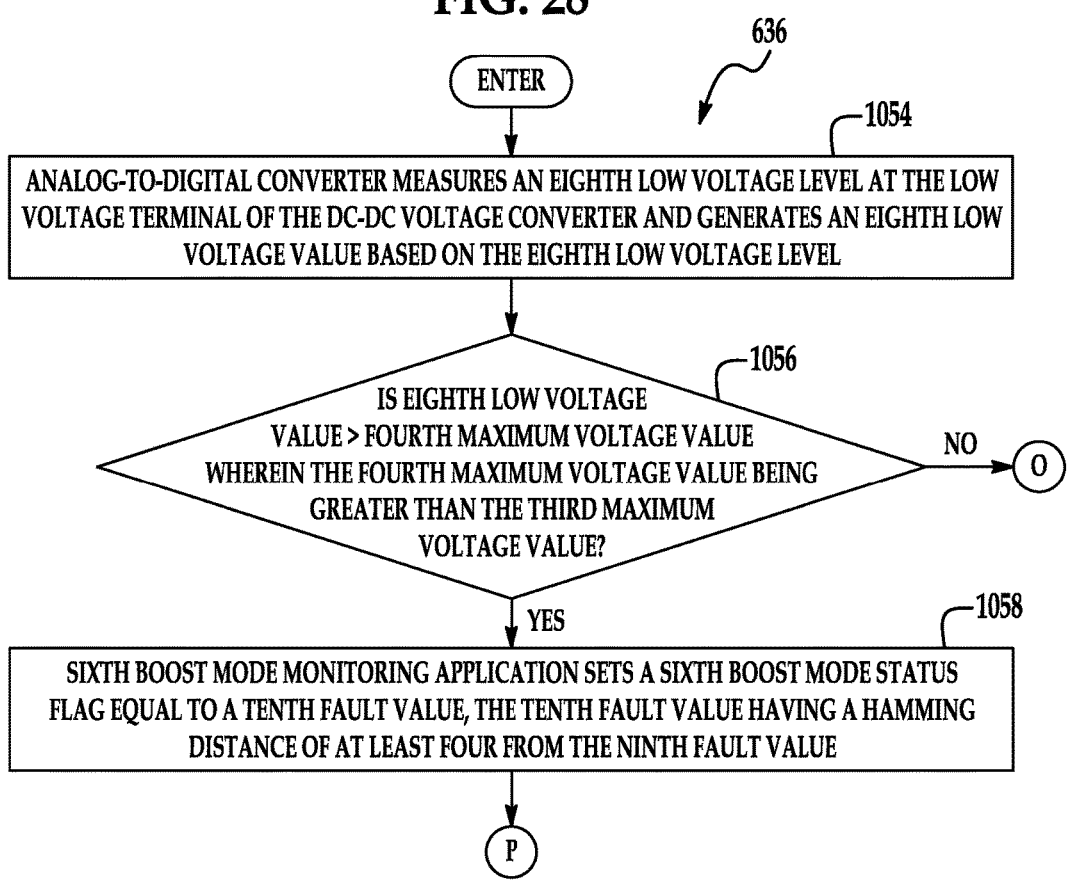
FIGS. 29-30 is a flowchart of a sixth boost mode monitoring application utilized in the diagnostic system of FIG. 1.
Figure 30:
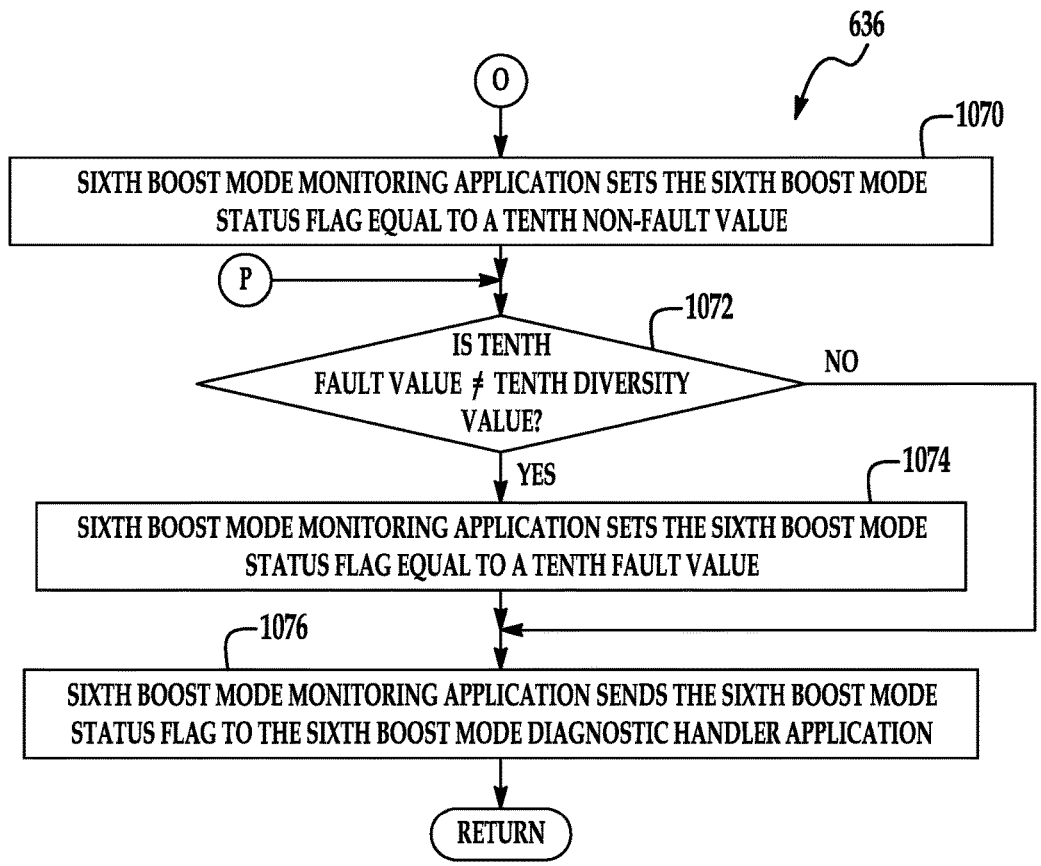

Referring to FIGS. 29 and 30, the sixth boost mode monitoring application 636 will now be explained. In particular, the sixth boost mode monitoring application 636 determines whether an overvoltage condition is detected at the low voltage terminal 264 during boost mode operation of the DC-DC voltage converter 100.

At step 1054, the analog-to-digital converter 390 measures an eighth low voltage level at the low voltage terminal 264 of the DC-DC voltage converter 100 and generates an eighth low voltage value based on the eighth low voltage level. After step 1054, the method advances to step 1056.

At step 1056, the sixth boost mode monitoring application 636 makes a determination as to whether the eighth low voltage value is greater than a fourth maximum voltage value, wherein the fourth maximum voltage value is greater than the third maximum voltage value. If the value of step 1056 equals "yes", the method advances to step 1058. Otherwise, the method advances to step 1070.

At step 1058, the sixth boost mode monitoring application 636 sets a sixth boost mode status flag equal to a tenth fault value (e.g., 7B shown in record 562 of the boost mode table 550 in FIG. 3). The tenth fault value has a Hamming distance of at least four from the ninth fault value. After step 1058, the method advances to step 1070.

At step 1070, the sixth boost mode monitoring application 636 sets the sixth boost mode status flag equal to a tenth non-fault value (e.g., B7 shown in record 562 of the boost mode table 550 in FIG. 3). After step 1070, the method advances to step 1072.

At step 1072, the sixth boost mode monitoring application 636 makes a determination as to whether a tenth fault value is not equal to a tenth diversity value. If the value of step 1072 equals "yes", the method advances to step 1074. Otherwise, the method advances to step 1076.

At step 1074, the sixth boost mode monitoring application 636 sets the sixth boost mode status flag equal to the tenth fault value (e.g., 7B shown in record 562 of the boost mode table 550 in FIG. 3). After step 1074, the method advances to step 1076.

At step 1076, the sixth boost mode monitoring application 636 sends the sixth boost mode status flag to the sixth boost mode diagnostic handler application 638. After step 1076, the method returns to the main application 600.

Figure 31:
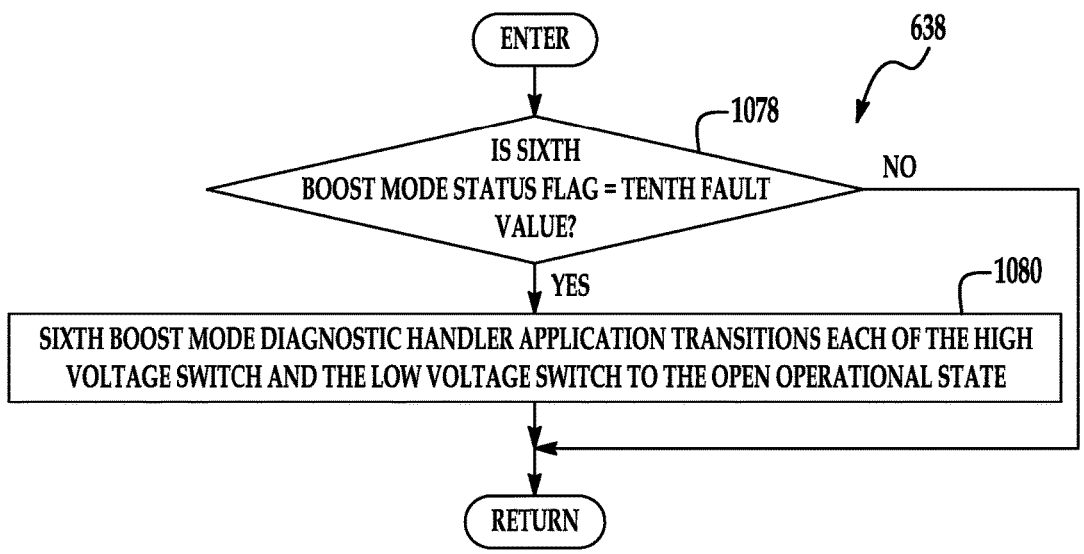
FIG. 31 is a flowchart of a sixth boost mode diagnostic handler application utilized in the diagnostic system of FIG. 1.

Referring to FIG. 31, the sixth boost mode diagnostic handler application 638 will now be explained.

At step 1078, the sixth boost mode diagnostic handler application 638 makes a determination as to whether the sixth boost mode status flag is equal to the tenth fault value (e.g., B7 shown in record 562 of the boost mode table 550 in FIG. 3). If the value of step 1078 equals "yes", the method advances to step 1080. Otherwise, the method returns to the main application 600.

At step 1080, the sixth boost mode diagnostic handler application 638 transitions each of the high voltage switch 250 and the low voltage switch 254 to the open operational state. After step 1080, the method returns to the main application 600.

The diagnostic system described herein for a DC-DC voltage converter provides a substantial advantage over other systems. In particular, the diagnostic system described herein utilizes fault values having a Hamming distance of at least four from one another to eliminate memory overwrite errors associated with status flags utilizing the values, in a buck operational mode. Further, the diagnostic system utilizes fault values having a Hamming distance of at least four from one another to eliminate memory overwrite errors associated with status flags utilizing the values, in a boost operational mode.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a DC-DC voltage converter operating in a buck operational mode, the DC-DC voltage converter having a high voltage switch, a low voltage switch, a DC-DC converter control circuit, a high voltage terminal, and a low voltage terminal; the DC-DC converter control circuit being electrically coupled between and to the high voltage switch and the low voltage switch, the high voltage switch being further electrically coupled to the high voltage terminal, the low voltage switch being further electrically coupled to the low voltage terminal, the diagnostic system comprising:

a microcontroller having a microprocessor and an analog-to-digital converter, the microprocessor having a first buck mode monitoring application, a first buck mode diagnostic handler application, a second buck mode monitoring application, and a second buck mode diagnostic handler application;

the analog to digital converter measuring a first low voltage level at the low voltage terminal of the DC-DC voltage converter and generating a first low voltage value based on the first low voltage level;

the first buck mode monitoring application setting a first buck mode status flag equal to a first fault value when the first low voltage value is greater than a first maximum voltage value;

the first buck mode diagnostic handler application transitioning each of the high voltage switch and the low voltage switch to an open operational state when the first buck mode status flag is equal to the first fault value;
the analog to digital converter measuring a second low voltage level at the low voltage terminal of the DC-DC voltage converter and generating a second low voltage value based on the second low voltage level;
the second buck mode monitoring application setting a second buck mode status flag equal to a second fault value when the second low voltage value is greater than a second maximum voltage value, the second maximum voltage value being greater than the first maximum voltage value; the second fault value having a Hamming distance of at least four from the first fault value; and
the second buck mode diagnostic handler application transitioning each of the high voltage switch and the low voltage switch to the open operational state when the second buck mode status flag is equal to the second fault value.

2. The diagnostic system of claim 1, wherein the first buck mode monitoring application setting the first buck mode status flag equal to a first non-fault value when the first low voltage value is less than or equal to the first maximum voltage value, the first non-fault value having a Hamming distance of at least four from the first fault value.

3. The diagnostic system of claim 2, wherein the second buck mode monitoring application setting the second buck mode status flag equal to a second non-fault value when the second low voltage value is less than or equal to the second maximum voltage value, the second non-fault value having a Hamming distance of at least four from the second fault value.

4. The diagnostic system of claim 3, wherein the first non-fault value has a Hamming distance of at least four from the second non-fault value.

5. The diagnostic system of claim 1, wherein:
the first buck mode monitoring application setting the first buck mode status flag equal to the first fault value when the first fault value is not equal to a first diversity value; and
the second buck mode monitoring application setting the second buck mode status flag equal to the second fault value when the second fault value is not equal to a second diversity value.

6. The diagnostic system of claim 1, wherein the microprocessor further includes a third buck mode monitoring application, a third buck mode diagnostic handler application, a fourth buck mode monitoring application, and a fourth buck mode diagnostic handler application;
the analog to digital converter measuring a third low voltage level at the low voltage terminal of the DC-DC voltage converter and generating a third low voltage value based on the third low voltage level;
the third buck mode monitoring application setting a third buck mode status flag equal to a third fault value when the third low voltage value is less than a first minimum voltage value;
the third buck mode diagnostic handler application transitioning each of the high voltage switch and the low voltage switch to the open operational state when the third buck mode status flag is equal to the third fault value;
the analog to digital converter measuring a fourth low voltage level at the low voltage terminal of the DC-DC voltage converter and generating a fourth low voltage value based on the fourth low voltage level;
the fourth buck mode monitoring application setting a fourth buck mode status flag equal to a fourth fault value when the fourth low voltage value is less than a second minimum voltage value; the second minimum voltage value being less than the first minimum voltage value; the fourth fault value having a Hamming distance of at least four from the third fault value; and
the fourth buck mode diagnostic handler application transitioning each of the high voltage switch and the low voltage switch to the open operational state when the fourth buck mode status flag is equal to the fourth fault value.

7. The diagnostic system of claim 6, wherein the third buck mode monitoring application setting the third buck mode status flag equal to a third non-fault value when the third low voltage value is greater than or equal to the first minimum voltage value; the third non-fault value having a Hamming distance of at least four from the third fault value.

8. The diagnostic system of claim 7, wherein the fourth buck mode monitoring application setting the fourth buck mode status flag equal to a fourth non-fault value when the fourth low voltage value is greater than or equal to the second minimum voltage value, the fourth non-fault value having a Hamming distance of at least four from the fourth fault value.

9. The diagnostic system of claim 8, wherein the third non-fault value has a Hamming distance of at least four from the fourth non-fault value.

10. The diagnostic system of claim 6, wherein
the third buck mode monitoring application setting the third buck mode status flag equal to the third fault value when the third fault value is not equal to a third diversity value;
the fourth buck mode monitoring application setting the fourth buck mode status flag equal to the fourth fault value when the fourth fault value is not equal to a fourth diversity value.

11. A diagnostic system for a DC-DC voltage converter operating in a boost operational mode, the DC-DC voltage converter having a high voltage switch, a low voltage switch, a DC-DC converter control circuit, a high voltage terminal, and a low voltage terminal; the DC-DC converter control circuit being electrically coupled between and to the high voltage switch and the low voltage switch, the high voltage switch being further electrically coupled to the high voltage terminal, the low voltage switch being further electrically coupled to the low voltage terminal, the diagnostic system comprising:
a microcontroller having a microprocessor and an analog-to-digital converter, the microprocessor having a first boost mode monitoring application, a first boost mode diagnostic handler application, a second boost mode monitoring application, and a second boost mode diagnostic handler application;
the analog to digital converter measuring a first high voltage level at the high voltage terminal of the DC-DC voltage converter and generating a first high voltage value based on the first high voltage level;
the first boost mode monitoring application setting a first boost mode status flag equal to a first fault value when the first high voltage value is greater than a first maximum voltage value;
the first boost mode diagnostic handler application transitioning each of the high voltage switch and the low voltage switch to an open operational state when the first boost mode status flag is equal to the first fault value;

the analog to digital converter measuring a second high voltage level at the high voltage terminal of the DC-DC voltage converter and generating a second high voltage value based on the second high voltage level;

the second boost mode monitoring application setting a second boost mode status flag equal to a second fault value when the second high voltage value is greater than a second maximum voltage value, the second maximum voltage value being greater than the first maximum voltage value; the second fault value having a Hamming distance of at least four from the first fault value; and the second boost mode diagnostic handler application transitioning each of the high voltage switch and the low voltage switch to the open operational state when the second boost mode status flag is equal to the second fault value.

12. The diagnostic system of claim 11, wherein the first boost mode monitoring application setting the first boost mode status flag equal to a first non-fault value when the first high voltage value is less than or equal to the first maximum voltage value, the first non-fault value having a Hamming distance of at least four from the first fault value.

13. The diagnostic system of claim 12, wherein the second boost mode monitoring application setting the second boost mode status flag equal to a second non-fault value when the second high voltage value is less than or equal to the second maximum voltage value, the second non-fault value having a Hamming distance of at least four from the second fault value.

14. The diagnostic system of claim 13, wherein the first non-fault value has a Hamming distance of at least four from the second non-fault value.

15. The diagnostic system of claim 11, wherein:
the first boost mode monitoring application setting the first boost mode status flag equal to the first fault value when the first fault value is not equal to a first diversity value; and
the second boost mode monitoring application setting the second boost mode status flag equal to the second fault value when the second fault value is not equal to a second diversity value.

16. The diagnostic system of claim 11, wherein the microprocessor further includes a third boost mode monitoring application, a third boost mode diagnostic handler application, a fourth boost mode monitoring application, and a fourth boost mode diagnostic handler application;
the analog to digital converter measuring a first low voltage level at the low voltage terminal of the DC-DC voltage converter and generating a first low voltage value based on the first low voltage level;
the third boost mode monitoring application setting a third boost mode status flag equal to a third fault value when the first low voltage value is less than a first minimum voltage value;

the third boost mode diagnostic handler application transitioning each of the high voltage switch and the low voltage switch to the open operational state when the third boost mode status flag is equal to the third fault value;

the analog to digital converter measuring a second low voltage level at the low voltage terminal of the DC-DC voltage converter and generating a second low voltage value based on the second low voltage level;

the fourth boost mode monitoring application setting a fourth boost mode status flag equal to a fourth fault value when the second low voltage value is less than a second minimum voltage value; the second minimum voltage value being less than the first minimum voltage value; the fourth fault value having a Hamming distance of at least four from the third fault value; and the fourth boost mode diagnostic handler application transitioning each of the high voltage switch and the low voltage switch to the open operational state when the fourth boost mode status flag is equal to the fourth fault value.

17. The diagnostic system of claim 16, wherein the microprocessor further includes a fifth boost mode monitoring application, a fifth boost mode diagnostic handler application, a sixth boost mode monitoring application, and a sixth boost mode diagnostic handler application;
the analog to digital converter measuring a third low voltage level at the low voltage terminal of the DC-DC voltage converter and generating a third low voltage value based on the third low voltage level;
the fifth boost mode monitoring application setting a fifth boost mode status flag equal to a fifth fault value when the third low voltage value is greater than a third maximum voltage value;
the fifth boost mode diagnostic handler application transitioning each of the high voltage switch and the low voltage switch to the open operational state when the fifth boost mode status flag is equal to the fifth fault value;
the analog to digital converter measuring a fourth low voltage level at the low voltage terminal of the DC-DC voltage converter and generating a fourth low voltage value based on the fourth low voltage level;
the sixth boost mode monitoring application setting a sixth boost mode status flag equal to a sixth fault value when the fourth low voltage value is greater than a fourth maximum voltage value; the fourth maximum voltage value being greater than the third maximum voltage value; the sixth fault value having a Hamming distance of at least four from the fifth fault value; and
the sixth boost mode diagnostic handler application transitioning each of the high voltage switch and the low voltage switch to the open operational state when the sixth boost mode status flag is equal to the sixth fault value.

\* \* \* \* \*